(12) United States Patent
Tsurumaru

(10) Patent No.: US 10,175,275 B2
(45) Date of Patent: Jan. 8, 2019

(54) SEMICONDUCTOR INTEGRATED CIRCUIT DEVICE AND ELECTRONICS DEVICE

(71) Applicant: Renesas Electronics Corporation, Tokyo (JP)

(72) Inventor: Makoto Tsurumaru, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 161 days.

(21) Appl. No.: 15/173,397

(22) Filed: Jun. 3, 2016

(65) Prior Publication Data
US 2016/0356655 A1 Dec. 8, 2016

(30) Foreign Application Priority Data
Jun. 8, 2015 (JP) .................................. 2015-115540

(51) Int. Cl.
| | | |
|---|---|---|
| *G01K 13/00* | (2006.01) | |
| *H01L 27/06* | (2006.01) | |
| *G01R 21/133* | (2006.01) | |
| *H01L 29/739* | (2006.01) | |
| *G01K 7/42* | (2006.01) | |

(52) U.S. Cl.
CPC ............. *G01R 21/133* (2013.01); *G01K 7/42* (2013.01); *H01L 29/7395* (2013.01)

(58) Field of Classification Search
CPC ..... G01R 21/133; G01K 7/42; H01L 29/7395
See application file for complete search history.

(56) References Cited

U.S. PATENT DOCUMENTS

| | | | | |
|---|---|---|---|---|
| 2005/0204761 A1* | 9/2005 | Karikomi | ............... | G01K 7/425 62/228.1 |
| 2009/0161726 A1* | 6/2009 | Miyamoto | ............... | G01K 7/01 374/172 |
| 2010/0074610 A1* | 3/2010 | Trevelyan | .............. | G03B 15/03 396/158 |

(Continued)

FOREIGN PATENT DOCUMENTS

| | | |
|---|---|---|
| JP | 3075303 B2 | 8/2000 |
| JP | 2011-097812 A | 5/2011 |
| WO | WO 2014/091852 A1 | 1/2017 |

OTHER PUBLICATIONS

Guo et al. Power Losses and Temperature Variations in a Power Converter for an Electronic Power Steering System Considering Steering Profiles, 2014, p. 40-46.*

(Continued)

*Primary Examiner* — John Breene
*Assistant Examiner* — Mohammad Islam
(74) *Attorney, Agent, or Firm* — McGinn I.P. Law Group, PLLC.

(57) ABSTRACT

A semiconductor integrated circuit device includes a temperature prediction circuit that predicts the temperature of a power semiconductor device having a built-in switching transistor. The temperature prediction circuit includes: a delay circuit that stores a history of electric power values for a specific number of times, the electric power values being calculated based on the steady loss and switching loss of the switching transistor; and a circuit that calculates the temperature prediction value of the power semiconductor device based on the value of the delay circuit and a time factor corresponding to a temperature heat dissipation characteristic.

20 Claims, 28 Drawing Sheets

(56) References Cited

U.S. PATENT DOCUMENTS

| | | | |
|---|---|---|---|
| 2012/0217795 A1 | 8/2012 | Hasegawa et al. | |
| 2014/0239741 A1* | 8/2014 | Cade | H03K 17/14 307/117 |
| 2015/0098163 A1* | 4/2015 | Ferrara | H02H 5/04 361/113 |
| 2015/0211938 A1 | 7/2015 | Imakire et al. | |
| 2016/0084717 A1* | 3/2016 | Jeong | B60R 16/02 374/170 |
| 2016/0334280 A1* | 11/2016 | Hasan | G01K 7/01 |
| 2017/0317664 A1* | 11/2017 | Komo | H01L 31/12 |

OTHER PUBLICATIONS

Marz et al. Thermal Modeling of Power-electronic Systems, 1999, p. 1-20.*

Blasko et al. On Line Thermal Model and Thermal Management Strategy of a Three Phase Voltage Source Inverter, 1999, p. 1423-1431.*

Heatsink Application Note AN-1057, 2003, p. 1-17.*

Japanese Office Action dated Nov. 27, 2018, with an English translation thereof.

* cited by examiner

SEMICONDUCTOR INTEGRATED CIRCUIT DEVICE AND ELECTRONICS DEVICE

CLAIM OF PRIORITY

The present application claims priority from Japanese Patent Application JP2015-115540 filed on Jun. 8, 2015, the content of which is hereby incorporated by reference into this application.

BACKGROUND

The present disclosure relates to a semiconductor integrated circuit device, which is applicable to the prediction of the temperature of a power semiconductor device, for example.

For the switching device of a power converter, such as an inverter, an insulated-gate bipolar transistor (IGBT) is used, which is a power semiconductor device. An IGBT chip has a built-in temperature detection diode, which is used for detecting abnormal temperatures of the IGBT.

A related art document related to the present disclosure is Japanese Unexamined Patent Application Publication No. 2011-97812, for example.

SUMMARY

The thermal conduction time between the heat generating unit of a switching device and a temperature detector causes a delay in the detection of a temperature, resulting in a poor function of protection for the switching device.

Other problems and novel features will be apparent from the description of the present specification and the accompanying drawings.

In the present disclosure, a brief description of a representative aspect is as follows.

In other words, a semiconductor integrated circuit device includes a temperature prediction circuit that predicts a temperature of a power semiconductor device having a built-in switching transistor. The temperature prediction circuit includes: a delay circuit that stores a history of electric power values for a specific number of times, the electric power values being calculated based on a steady loss and a switching loss of the switching transistor; and a circuit that calculates a prediction temperature value of the power semiconductor device based on a value of the delay circuit and a time factor corresponding to a temperature heat dissipation characteristic.

According to the semiconductor integrated circuit device, a delay in the detection of a temperature can be reduced.

DESCRIPTION OF THE PREFERRED EMBODIMENTS

Figure 1:
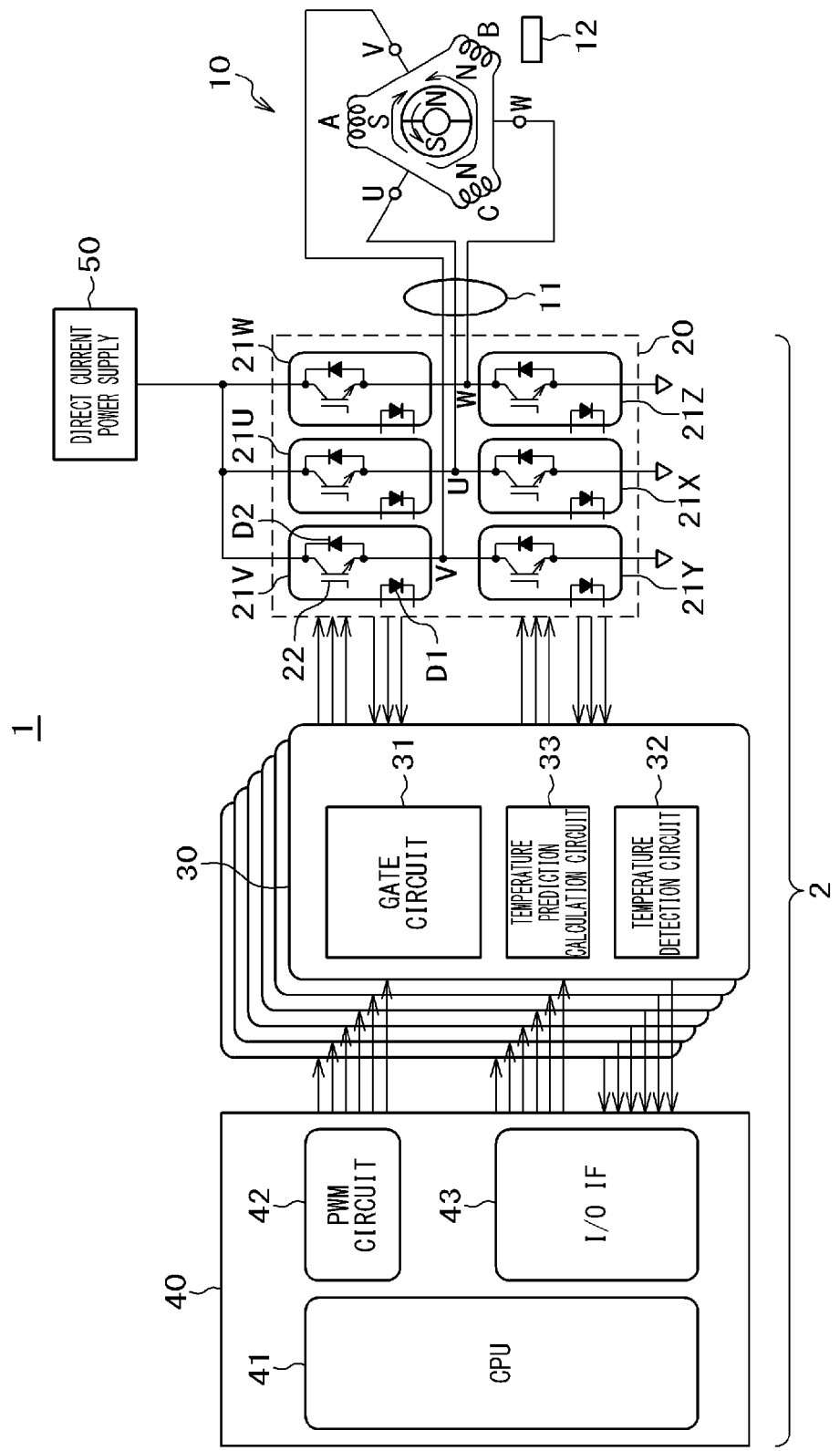
FIG. 1 is a block diagram for explaining an electric motor system according to a first embodiment.

In the following, embodiments will be described with reference to the drawings. However, in the following description, the same components are designated the same reference numerals and signs, and the overlapping description is sometimes omitted.

An electric motor (a motor) is used for the power source of a hybrid electric vehicle (HEV) combined with an internal combustion engine (a petrol engine), for an electric vehicle (EV), or for other vehicles. In driving the electric motor, a power converter (an inverter) that converts a direct current into an alternating current is used for obtaining a predetermined torque and a power supply frequency. The operating temperature of the inverter is considerably varied depending on the running environment of the automobile. More specifically, in the HEV having an inverter installed on its engine room, the temperature of the inverter becomes high because of the influence of the heat generated from the engine. In addition to such an ambient temperature, the temperature of a switching device inside the inverter is increased because of the influence of a steady loss caused by carrying an electric current through the switching device itself, and a switching loss caused by turning on and off the switching device. Thus, when its temperature exceeds a certain temperature, the switching device is likely to fail.

In addition to the switching device, in the inverter, a drive circuit that drives the switching device and a control circuit that controls the drive circuit are used. The drive circuit has a gate circuit that drives the switching device, and also has the functions of protecting the switching device against an overcurrent and overheat caused by high temperatures, for example. The switching device is configured of a semiconductor chip. In the semiconductor chip, a switching transistor configured of an IGBT and a temperature detection diode, for example, are built-in. After an electric current is carried from an electric current source in the drive circuit, a comparator in the drive circuit determines whether the temperature of the chip of the switching device is a temperature corresponding to the reference voltage or higher, using the electric current-to-temperature characteristics (characteristics in which an increase in the temperature decreases the forward voltage (VF) with respect to the same current value) of the temperature detection diode. In the case in which the temperature detected at the temperature detection diode is a set value or greater, an alarm signal is outputted to the control circuit, and a signal is also outputted to the gate circuit for forcedly interrupting the switching device. Note that, in the case in which an alarm signal is outputted, the control circuit also forcedly stops the device.

An example will be described in which the detection of an abnormal temperature is delayed because of the thermal conduction time between the heat generating unit of the switching device and a temperature detector. A chip including a switching transistor configured of an IGBT and a temperature detection diode on one semiconductor substrate is referred to as an IGBT chip.

Figure 33:
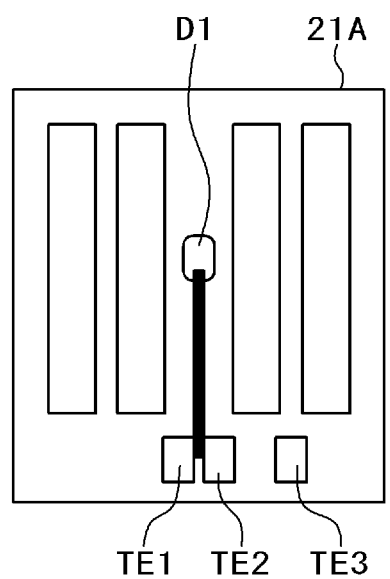
FIG. 33 is a plan view for explaining a delay in the measurement of the temperature of a temperature detection diode.

FIG. 33 is a plan view of an IGBT chip having a temperature detection diode disposed in the center of the chip. In an IGBT chip 21A in FIG. 33, a temperature detection diode D1 is disposed in the center of the chip. The temperature detection diode D1 is connected to terminals TE1 and TE2. The terminal TE1 is connected to a drive circuit. The terminal TE2 is connected to a ground potential. Note that, a terminal TE3 is a current sense emitter terminal.

Figure 34:
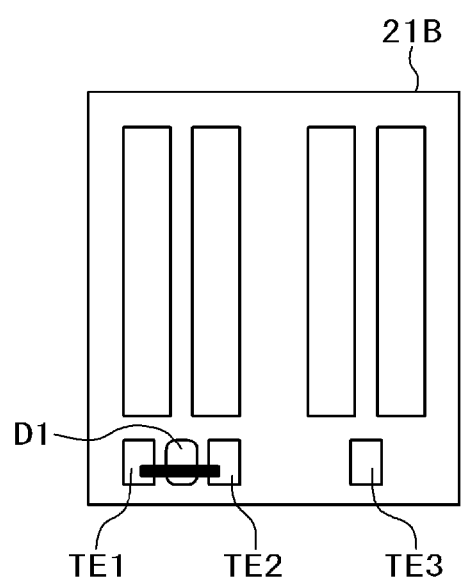
FIG. 34 is a plan view for explaining a delay in the measurement of the temperature of a temperature detection diode.

FIG. 34 is a plan view of an IGBT chip having a temperature detection diode disposed on the end of the chip. In an IGBT chip 21B in FIG. 34, a temperature detection diode D1 is disposed on the end of the chip. The temperature detection diode D1 is connected to terminals TE1 and TE2. The terminal TE1 is connected to a drive circuit. The terminal TE2 is connected to a ground potential. Note that, the terminal TE3 is a current sense emitter terminal.

Figure 35:
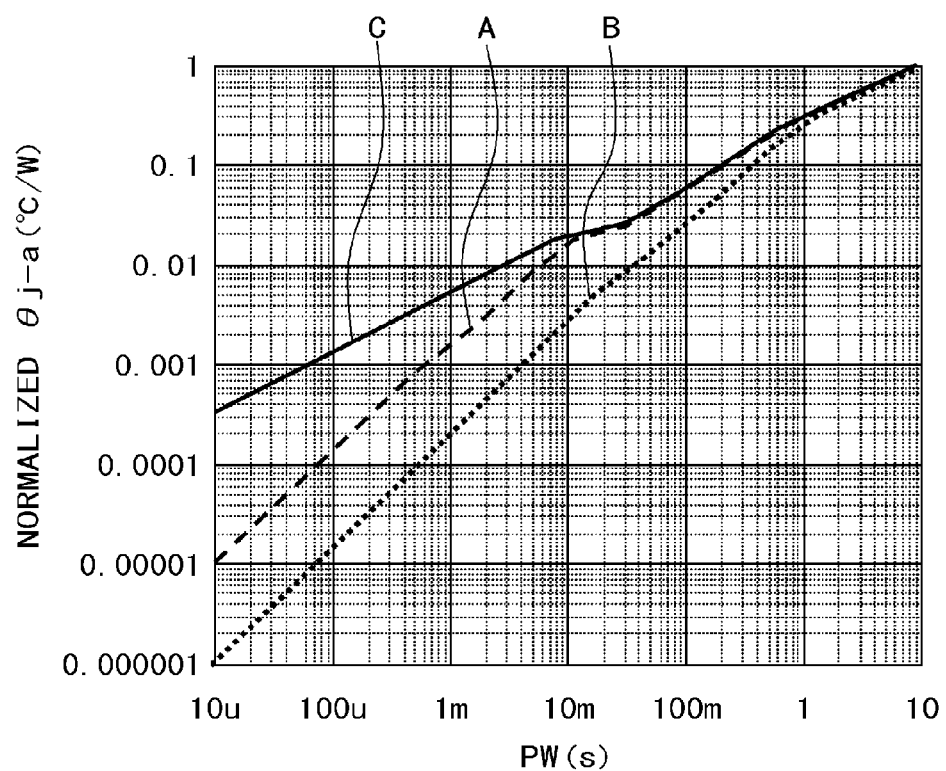
FIG. 35 is a graph for explaining a delay in the measurement of the temperature of a temperature detection diode.
Figure 36:
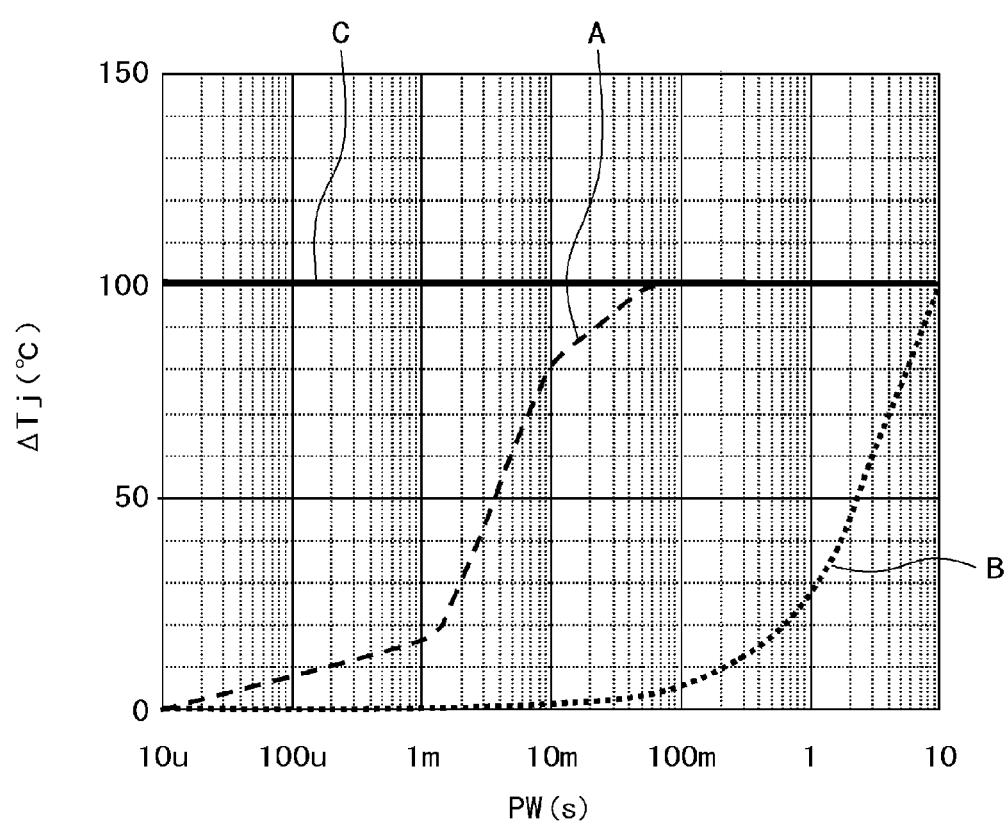
FIG. 36 is a graph for explaining a delay in the measurement of the temperature of a temperature detection diode.

FIG. 35 is a graph of the relationship between the thermal resistance and the operating time. Solid line C expresses the thermal resistance of the chip itself. Broken lines A and B express thermal resistances converted from changes in the characteristics of a temperature detection diode. FIG. 36 is a graph of the relationship between the temperature and the operating time. Solid line C expresses the temperature of a chip itself in the case in which the temperature is fixed to 100° C. Broken lines A and B express temperatures converted from changes in the characteristics of a temperature detection diode. In the case in which the temperature detection diode D1 is disposed in the center of the IGBT chip 21A, as illustrated in broken lines A in FIGS. 35 and 36, the response time is 100 ms. On the other hand, in the case in which the temperature detection diode D1 is disposed on the end of the chip, as illustrated in broken lines B in FIGS. 35 and 36, the response time has a delay of about ten seconds. As described above, in the case in which the thermal conduction time between the heat generating unit of the switching device and the temperature detector is great and the detection of the temperature is delayed, interrupt control is performed based on the measurement of the temperature. However, the possibility of exceeding the allowable operating temperature of the switching device is increased due to a delay in the response time. Alternatively, an interrupt set value includes a margin, taking into account of the response time. Thus, a range of the allowable operating temperature of the switching device is narrowed.

EMBODIMENT

Figure 37:
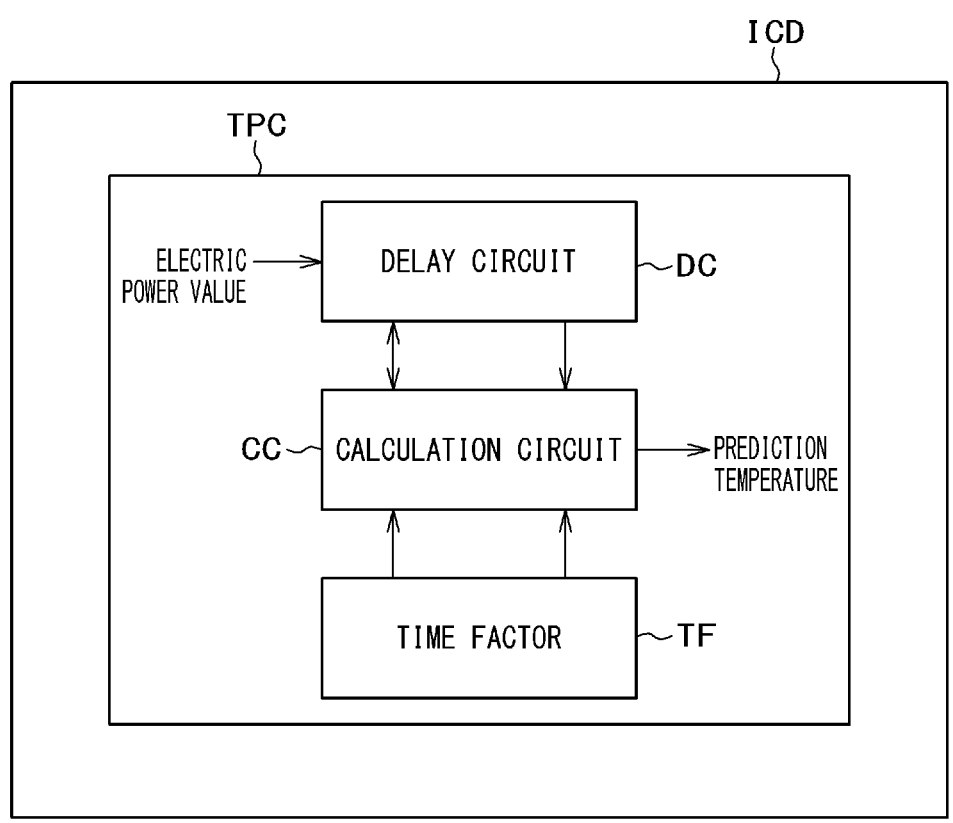
FIG. 37 is a block diagram for explaining a semiconductor integrated circuit device according to an embodiment.

FIG. 37 is a block diagram of a semiconductor integrated circuit device according to an embodiment. A semiconductor integrated circuit device ICD in FIG. 37 includes a temperature prediction circuit TPC that predicts the temperature of a power semiconductor device having a built-in switching transistor and a built-in temperature detection diode. The temperature prediction circuit TPC includes a delay circuit DC and a calculation circuit CC. The delay circuit DC stores a history of electric power values for a specific number of times, in which the electric power values are calculated based on the steady loss and switching loss of the switching transistor. The calculation circuit CC calculates the temperature prediction value of the power semiconductor device based on the value of the delay circuit DC and a time factor TF corresponding to a temperature heat dissipation characteristic.

The semiconductor integrated circuit device ICD can predict the temperature of the power semiconductor device. Thus, a delay in the detection of the temperature of the power semiconductor device can be reduced.

First Embodiment

Electric Motor System

FIG. 1 is a block diagram of the configuration of an electric motor system according to a first embodiment. An electric motor system 1 in FIG. 1 includes a three-phase motor 10, a power module 20 using six power semiconductor devices, six driver ICs 30, a control circuit 40, and a direct current power supply 50. A unit configured of the power module 20, the six driver ICs 30, and the control circuit 40 is referred to as an electronics device 2. The power module 20 controls the turning on and off of switching transistors 22 in the inside of the power module 20 in such a manner that in driving a vehicle, for example, an electric current is carried from the voltage of the direct current power supply 50 to each of the phases of the three-phase motor 10. The power module 20 changes the velocity of the vehicle, for example, with frequencies caused by this switching. In breaking a vehicle, for example, the power module 20 controls the turning on and off of the switching transistors 22 in synchronization with a voltage generated in each of the phases of the three-phase motor 10 for a so-called rectification operation. The power module 20 converts the voltage into a direct current voltage for regeneration.

In the three-phase motor 10, its rotor is configured of a permanent magnet and its armature is configured of a coil. The armature windings of three phases (a U-phase, a V-phase, and a W-phase) are disposed with a spacing at an angle of 120 degrees. The coils are in a delta connection. An electric current is always carried through three coils, i.e. a U-phase coil, a V-phase coil, and a W-phase coil. The three-phase motor 10 includes an electric current detector 11 and an angular-velocity-and-position detector 12.

The power module 20 configures bridge circuits in the U-phase, the V-phase, and the W-phase using the power semiconductor devices. The U-phase bridge circuit is connected to the three-phase motor 10 at its connecting point of a power semiconductor device 21U to a power semiconductor device 21X. The V-phase bridge circuit is connected to the three-phase motor 10 at its connecting point of a power semiconductor device 21V to a power semiconductor device 21Y. The W-phase bridge circuit is connected to the three-phase motor 10 at its connecting point of a power semiconductor device 21W to a power semiconductor device 21Z. Here, since the configurations of the power semiconductor devices 21U, 21V, 21W, 21X, 21Y, and 21Z are the same, these devices are sometimes referred to as the power semiconductor device 21 as a general term. The power semiconductor device 21 is configured of a semiconductor chip including a switching transistor configured of an IGBT (in the following, referred to as an IGBT) 22 and a temperature detection diode D1 and configured of a semiconductor chip including a flyback diode D2 connected in parallel between the emitter and collector of the IGBT 22. The flyback diode D2 is connected in such a manner that an electric current is carried in the reverse direction of an electric current carried through the IGBT 22. The semiconductor chip on which the IGBT 22 and the temperature detection diode D1 are formed and the semiconductor chip on which the flyback diode D2 is formed are preferably mounted on the same package. The flyback diode D1 may be formed on the semiconductor chip on which the IGBT 22 and the temperature detection diode D1 are formed.

The driver IC 30, which is a first semiconductor integrated circuit device, includes a gate circuit 31 that generates signals to drive the gate of the IGBT 22, a temperature detection circuit 32, and a temperature prediction calculation circuit 33 on one semiconductor substrate. The control circuit 40, which is a second semiconductor integrated circuit device, includes a CPU 41, a PWM circuit 42, and an I/O interface (I/O IF) 43 on one semiconductor substrate. The control circuit 40 is configured of a microcomputer unit (MCU), for example.

Driver IC and Control Circuit

Figure 2:
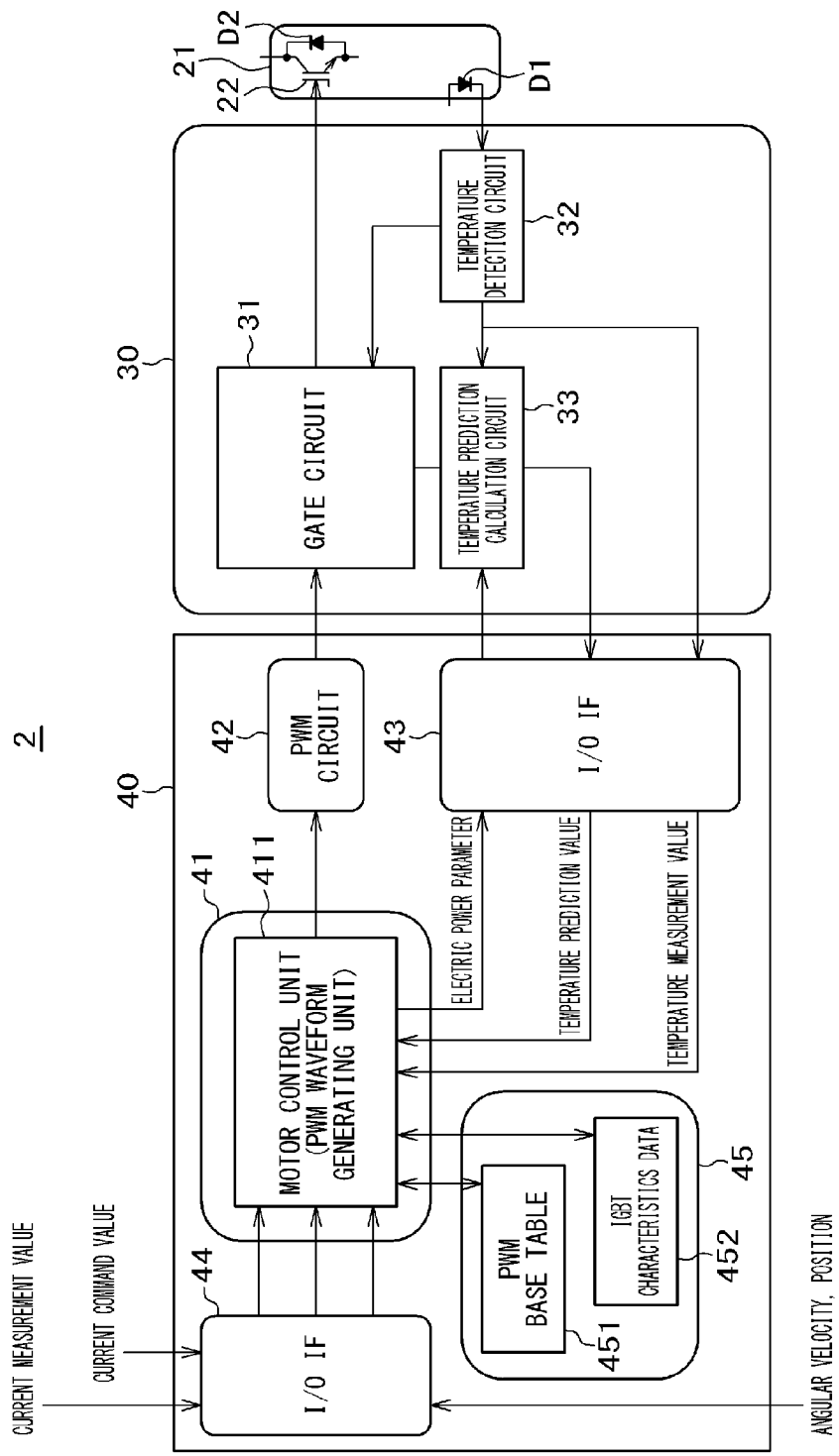
FIG. 2 is a block diagram for explaining an electronics device according to the first embodiment.

FIG. 2 is a block diagram of the electronics device, which is a part of the electric motor system according to the first embodiment. A motor control unit 411 in the inside of the CPU 41 compares an electric current (torque) command value with a present electric current (torque) measurement value, calculates a period (one power supply period and the inverse of one power supply frequency) corresponding to the duty ratio of PWM signals and the number of revolutions based on the angular velocity (the number of revolutions) of the motor and the position of the rotor for generating PWM signals at the PWM circuit 42. The PWM signal is used for controlling the turning on and off of the IGBT 22 of the power semiconductor device 21 through the gate circuit 31 of the driver IC 30. The current command value (the torque command value) from an accelerator device, for example, not shown, the present current measurement value (the torque measurement value) from the electric current detector 11, and the angular velocity (the number of revolutions) of the motor and the position of the rotor from the angular-velocity-and-position detector 12 are inputted to the CPU 41 through the I/O interface 44. Analog signals are inputted through an A/D converter. The motor control unit 411 is configured of software run by the CPU 41.

In parallel with the generation of PWM signals, the motor control unit 411 outputs electric power parameters and other parameters, such as the ON duration period of the PWM signal, a drive set current, and the number of switching operations for the PWM signals, to the temperature prediction calculation circuit 33 through the I/O interface 43.

The temperature prediction calculation circuit 33 calculates a temperature prediction value from an electric power value at the power semiconductor device 21 based on the electric power parameters from the motor control unit 411, and notifies the CPU 41 about the predicted result of an abnormal temperature (temperature prediction determination) through the I/O interface 43. The motor control unit 411 controls PWM signals to the gate circuit 31 for reducing and stopping the drive signals of the IGBT 22. Thus, the operation of the power semiconductor device 21 at abnormal temperatures can be prevented.

A PWM base table 451 stored on a storage device 45 includes the basic patterns of PWM signals for one power supply period and PWM patterns for calculating the heat dissipation factor of the power semiconductor device 21. IGBT characteristics data 452 stored on the storage device 45 includes the temperature characteristics of the saturation voltage to the drive current in the IGBT and the temperature characteristics of drive current to the switching loss. The storage device 45 is preferably configured of an electrically rewritable non-volatile memory, such as a flash memory. Programs run by the CPU 41 are preferably stored on an electrically rewritable non-volatile memory, such as a flash memory, or may be stored on the storage device 45.

The temperature detection circuit 32 of the driver IC 30 detects the forward voltage of the temperature detection diode D1, measures the temperature of the power semiconductor device 21 at high speed, and notifies the CPU 41 about the temperature through the temperature prediction calculation circuit 33 or the I/O interface 43. In the case in which the temperature of the power semiconductor device 21 reaches a high temperature exceeding a predetermined temperature (a temperature at which a device fails, such as a junction temperature), the temperature detection circuit 32 outputs a signal to the gate circuit 31 to perform an interrupting process for turning off the IGBT 22. The temperature detection circuit 32 includes an A/D converter, for example, configured of a comparator, a triangular wave generation circuit, and other devices.

Note that, signals transmitted between the driver IC 30 and the control circuit 40 are conveyed by the magnetic coupling of an isolator, not shown, which is built-in in the driver IC 30. This isolator is configured of an on-chip transformer formed of wires with the on-chip transformer being isolated using interlayer films.

Temperature Prediction Calculation Circuit

Figure 3:
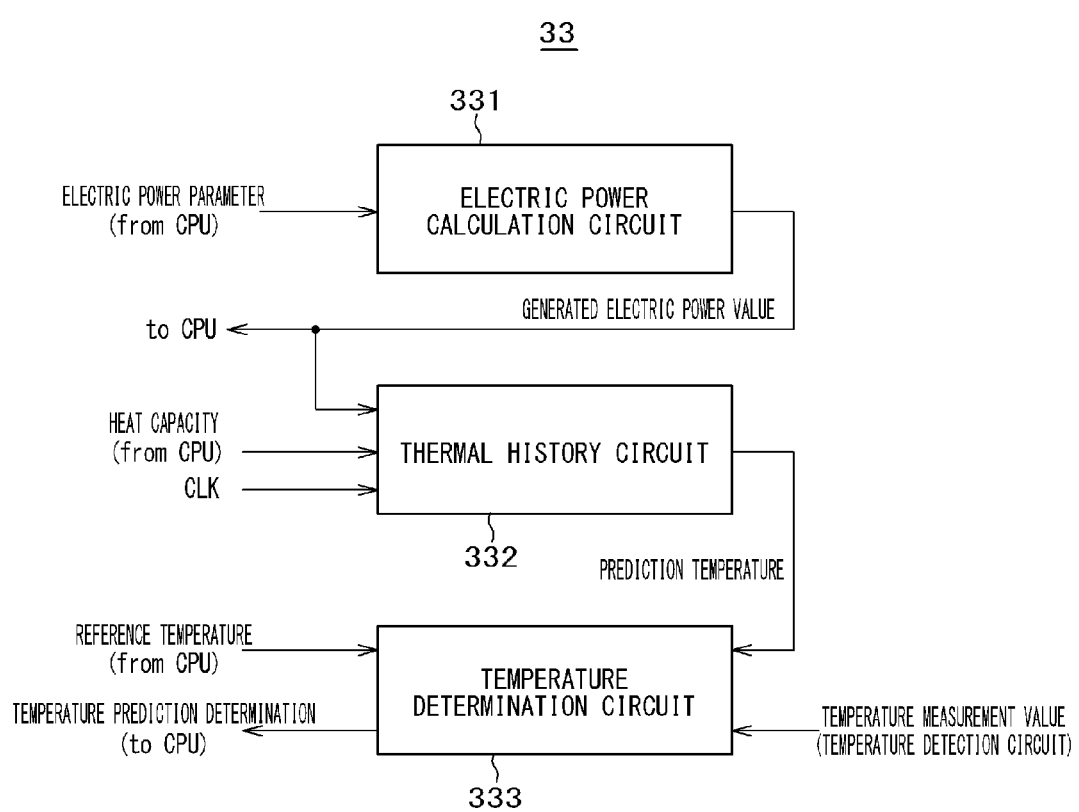
FIG. 3 is a block diagram for explaining a temperature prediction calculation circuit according to the first embodiment.

FIG. 3 is a block diagram of the temperature prediction calculation circuit according to the first embodiment. The temperature prediction calculation circuit 33 in FIG. 3 includes an electric power calculation circuit 331 that calculates generated electric power (Pd) based on the electric power parameters, a thermal history circuit 332 that calculates a prediction temperature (Tp) based on the generated electric power (Pd) and the heat capacity, and a temperature determination circuit 333 that makes determination based on the prediction temperature (Tp), a temperature measurement value (Tm), and a reference temperature (T).

(a) Electric Power Calculation Circuit

Figure 4:
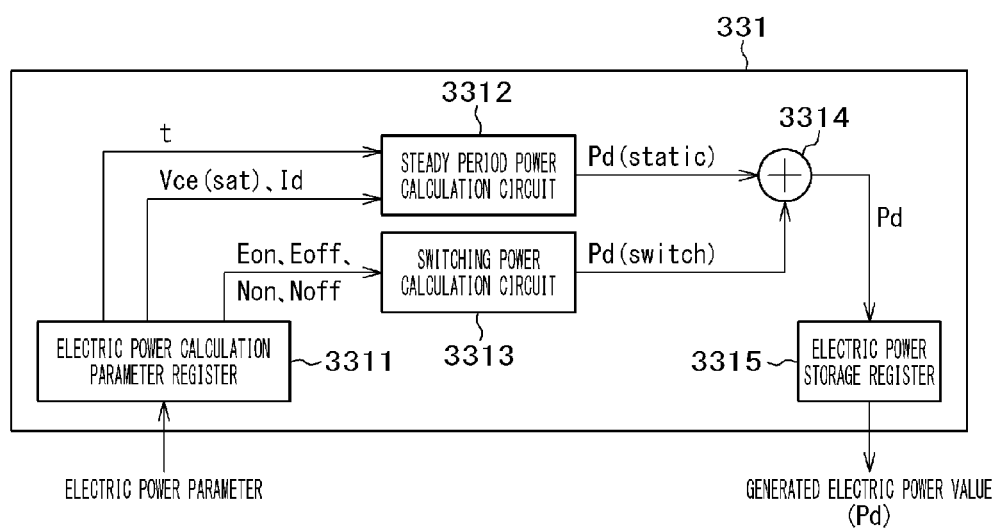
FIG. 4 is a block diagram for explaining an electric power calculation circuit according to the first embodiment.

FIG. 4 is a block diagram of the electric power calculation circuit according to the first embodiment. The electric power calculation circuit 331 in FIG. 4 calculates electric power per power supply period using a steady period power calculation circuit 3312, a switching power calculation circuit 3313, and an adder 3314 based on the electric power parameters, which are sent from the CPU 441 and set on an electric power calculation parameter register 3311, and outputs the electric power to the CPU 41 and the thermal history circuit 332 through an electric power storage register 3315.

Figure 9:
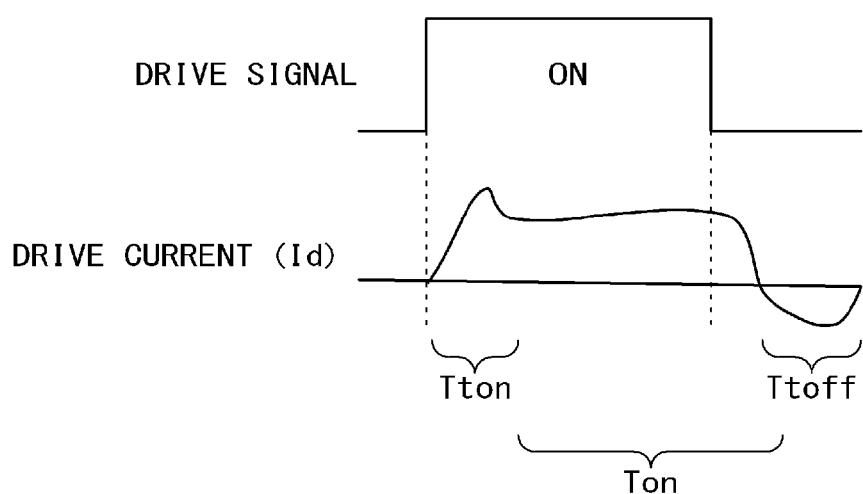
FIG. 9 is a diagram for explaining the switching operation of an IGBT.

FIG. 9 is a diagram for explaining the switching operation of the IGBT, showing the drive signal (a part of the PWM signal) of the IGBT 22 and a drive current (Id) waveform. The electric power of one drive signal is configured of the following item.

(A) A steady loss caused by the ON resistance of the IGBT 22 in an ON period (a steady period, Ton).

(B) A switching loss (a turn-on loss) in a turn-on period (Tton).

(C) A switching loss (a turn-off loss) in a turn-off period (Ttof).

Figure 10:
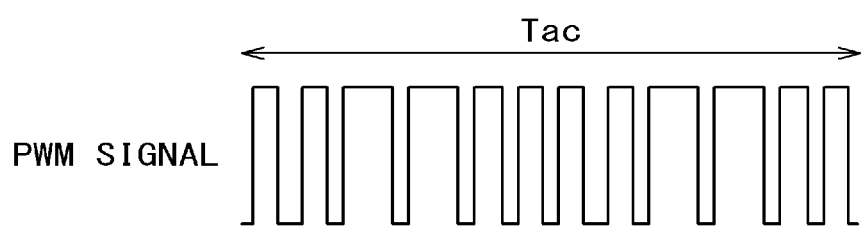
FIG. 10 is a diagram for explaining the drive signal of the IGBT.

FIG. 10 is a diagram for explaining the drive signal of the IGBT. The drive signal (the PWM signal) of the IGBT 22 in one power supply period (Tac) is configured of a plurality of pulses having different high periods (duties). In other words, in one power supply period, a plurality of pulses is present, whose time to turn on the IGBT 22 is different.

Under the conditions in which the PWM ON duration period per power supply period is defined as t, the saturation voltage of the IGBT 22 is defined as Vce(sat), and the drive current is defined as Id, the steady loss (Pd(static)) per power supply period can be found by Expression (1) below. Thus, the steady period power calculation circuit 3312 calculates Expression (1) below.

[Expression 1]

$$Pd(\text{static}) = \int_0^t Vce(sat) \times Id \quad (1)$$

Under the conditions in which the number of times to turn on the IGBT 22 per power supply period is defined as Non, the number of times to turn off the IGBT 22 is defined as Noff, the turn-on loss is defined as Eon, and the turn-off loss is defined as Eoff, the switching loss (Pd(switch)) per power supply period is found by Expression (2) below. Thus, the switching power calculation circuit 3313 calculates Expression (2).

[Expression 2]

$$Pd(\text{switch}) = Non \times Eon + Noff \times Eoff \quad (2)$$

Note that, the electric power parameters are the parameters t, Vce(sat), Id, Non, Noff, Eon, and Eoff described above. Pd, which is a generated electric power value for one power supply period, is the sum of Pd(static) and Pd(switch). Thus, the output of the steady period power calculation circuit 3312 is added to the output of the switching power calculation circuit 3313 at the adder 3314, and then Pd is found. Pd is stored on the electric power storage register 3315. As described above, the use of exclusive hardware allows the calculation of the generated electric power at high speed.

(b) Thermal History Circuit

Figure 5:
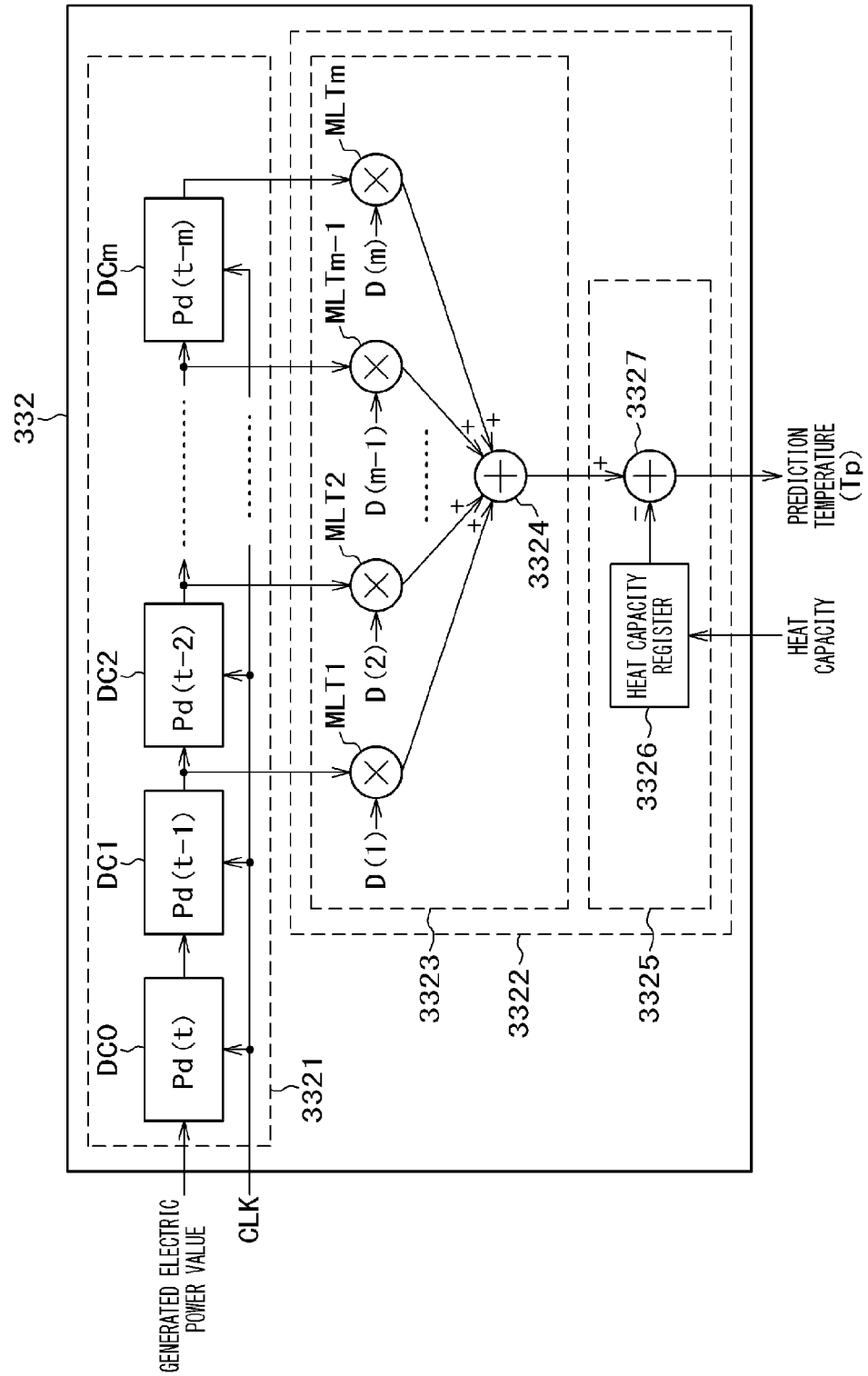
FIG. 5 is a block diagram for explaining a thermal history circuit according to the first embodiment.

FIG. 5 is a block diagram of the thermal history circuit according to the first embodiment. The thermal history circuit 332 in FIG. 5 includes a delay circuit 3321 and a calculation circuit 3322. The delay circuit 3321 sequentially captures the generated electric power values (Pd) calculated at the electric power calculation circuit 331 in delay circuits DC0, DC1, DC2, . . . , and DCm for the number of times for a predetermined time period based on thermal history sampling clocks (CLK). The delay circuit DC0 stores Pd(t), which is the latest generated electric power value. The delay circuit DCm stores Pd(t−m), which is the oldest generated electric power value.

The calculation circuit 3322 includes a sum-of-products circuit 3323 and a correction circuit 3325. The sum-of-products circuit 3323 multiplies Pd(t−1), Pd(t−2), . . . , Pd(t−m), which are the values of the delay circuits DC1, DC2, . . . , DCm−1, and DCm, by a time factor (D(n):n=1 to m) using multipliers MLT1, MLT2, MLTm−1, and MLTm, respectively, and then sums up the values at an adder 3324. In other words, the calculation circuit 3322 calculates Expression (3) below.

[Expression 3]

$$\sum_{n=1}^{n=m} D(n) \times Pd(t-n) \quad (3)$$

The influence of the time factor (D(n)) is decreased with a lapse of time depending on the temperature heat dissipation characteristics based on a heat generation equivalent model (FIG. 8), described later, for the power semiconductor device 21. Thus, the relationship among D(1) to D(m) becomes D(1)>D(2)> . . . >D(m).

The correction circuit 3325 corrects the summed value at the sum-of-products circuit 3323 by the quantity of generated heat set to a heat capacity register 3326 and a heat capacity to determine a temperature rise coefficient, and then finds the prediction temperature (Tp). More specifically, the correction circuit 3325 subtracts the output of the heat capacity register 3326 from the output of the sum-of-products circuit 3323 using an adder 3327, and then outputs the value as the prediction temperature (Tp) to the temperature determination circuit 333. Even in the case in which heat is generated to cause a temperature rise in the IGBT 22, the heat is stored in the heat capacity and dissipated through a heat sink. Thus, this event causes no temperature rise. In order to hold this event, the amount of the heat capacity is subtracted. As described above, the use of exclusive hardware allows the calculation of the prediction temperature at high speed.

(c) Temperature Determination Circuit

Figure 6:
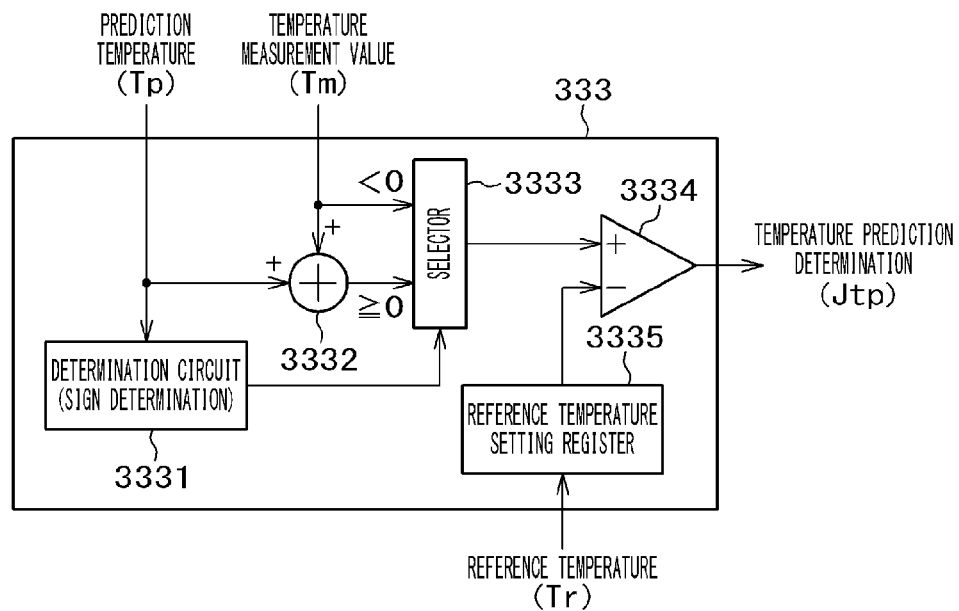
FIG. 6 is a block diagram for explaining a temperature determination circuit according to the first embodiment.

FIG. 6 is a block diagram of the temperature determination circuit according to the first embodiment. The temperature determination circuit 333 in FIG. 6 includes a determination circuit 3331, an adder 3332, a selector 3333, a comparator 3334, and a reference temperature setting register 3335. The determination circuit 3331 determines the sign of the prediction temperature (Tp) calculated at the thermal history circuit 332. In the case in which the prediction temperature (Tp) is a negative value, the temperature measurement value (Tm) detected at the temperature detection circuit 32 is selected at the selector 3333. In the case in which the prediction temperature (Tp) is zero or a positive value, a value (a temperature prediction value (Tpr)), in which the temperature measurement value (Tm) detected at the temperature detection circuit 32 is added to the prediction temperature (Tp) using the adder 3332, is selected. Note that, the electric power calculation circuit 331 basically calculates a power consumption value from the PWM waveform, which does not measure the absolute temperature. For the calculation, the electric power calculation circuit 331 calculates the prediction temperature (Tp) as a rise based on the power consumption value, starting from the temperature measurement value (Tm). Therefore, the temperature prediction value (Tpr) is a value in which the prediction temperature (Tp) is added to the temperature measurement value (Tm). The comparator 334 compares the temperature prediction value (Tpr) with the reference temperature (Tr) set at the reference temperature setting register 3335. In the case in which the temperature prediction value (Tpr) is higher than the reference temperature (Tr), the comparator 334 determines that the temperature is an abnormal temperature, and then outputs a temperature prediction determination (Jtp) to the CPU 41. As described above, the use of exclusive hardware allows the determination of the temperature at high speed.

The temperature measurement value is used for determining an abnormal temperature. Thus, the provision of the temperature prediction calculation circuit 33 in the driver IC 30, which also includes the temperature detection circuit 32, allows the detection of abnormal temperatures with no delay. The temperature prediction calculation circuit 33 is provided in each of the driver ICs 30. Thus, the temperatures of the power semiconductor devices 21U, 21V, 21W, 21X, 21Y, and 21Z can be predicted. Accordingly, an event, in which an abnormal temperature is observed in any of the power semiconductor devices 21U, 21V, 21W, 21X, 21Y, and 21Z, can be detected with no delay.

Heat Generation Equivalent Model

Figure 7:
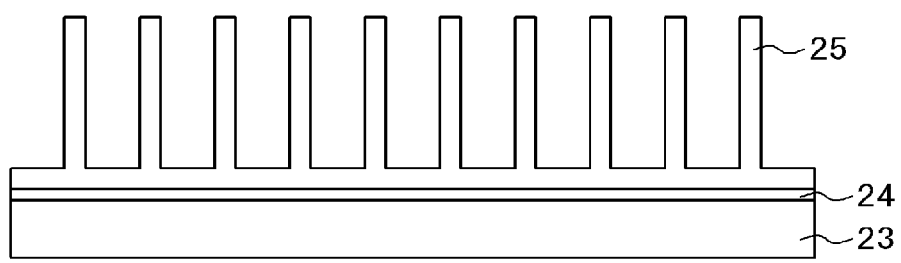
FIG. 7 is a side view for explaining the structure of a power semiconductor device.
Figure 8:
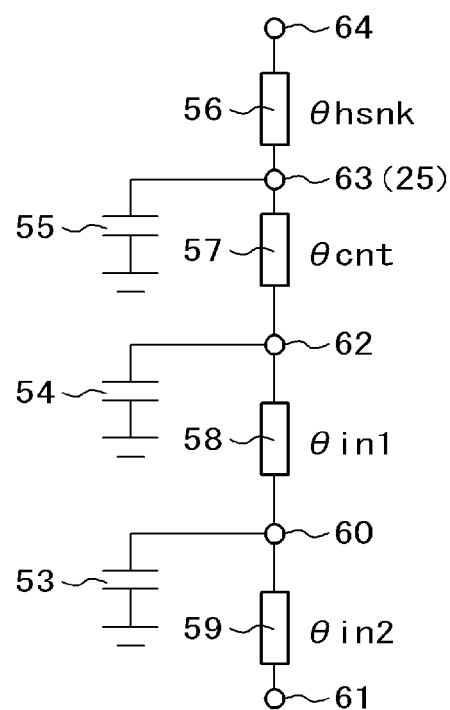
FIG. 8 is a diagram for explaining a heat generation equivalent model for the power semiconductor device.

FIG. 7 is a side view of the structure of the power semiconductor device. FIG. 8 is a diagram of a heat generation equivalent model for the power semiconductor device. The power semiconductor device 21 in FIG. 7 is configured of an IGBT chip 23 mounted on a package and a heat sink 25 attached to the IGBT chip 23 with an adhesive 24. The power semiconductor device 21 is mounted on a substrate 61. A junction 60 of the IGBT chip 23 is a heat source. The heat generation equivalent model in FIG. 8 has a first chip internal thermal resistance (θin1) between the junction 60 and a top face 62 (the top face of the package) of the IGBT chip 23 and a second chip internal thermal resistance (θin2) between the junction 60 and the substrate 61. The heat generation equivalent model also has a thermal contact resistance (θcnt) between the top face 62 of the IGBT chip 23 and a heat sink 63 (25) and a heat-sink thermal resistance (θhsnk) between the heat sink 63 and an ambient temperature 64. The heat generation equivalent model has a junction heat capacity 53 between the junction 60 and the ground power supply, an interconnect heat capacity 54 between the top face of the IGBT chip 23 and the ground power supply, and a heat-sink heat capacity 55 between the heat sink 63 and the ground power supply. Heat is dissipated from the thermal resistances, the generated heat is accumulated on the heat capacities, and then a delay occurs.

Relationship Between the Rotation Speed of the Motor and the PWM Signal

Figure 11:
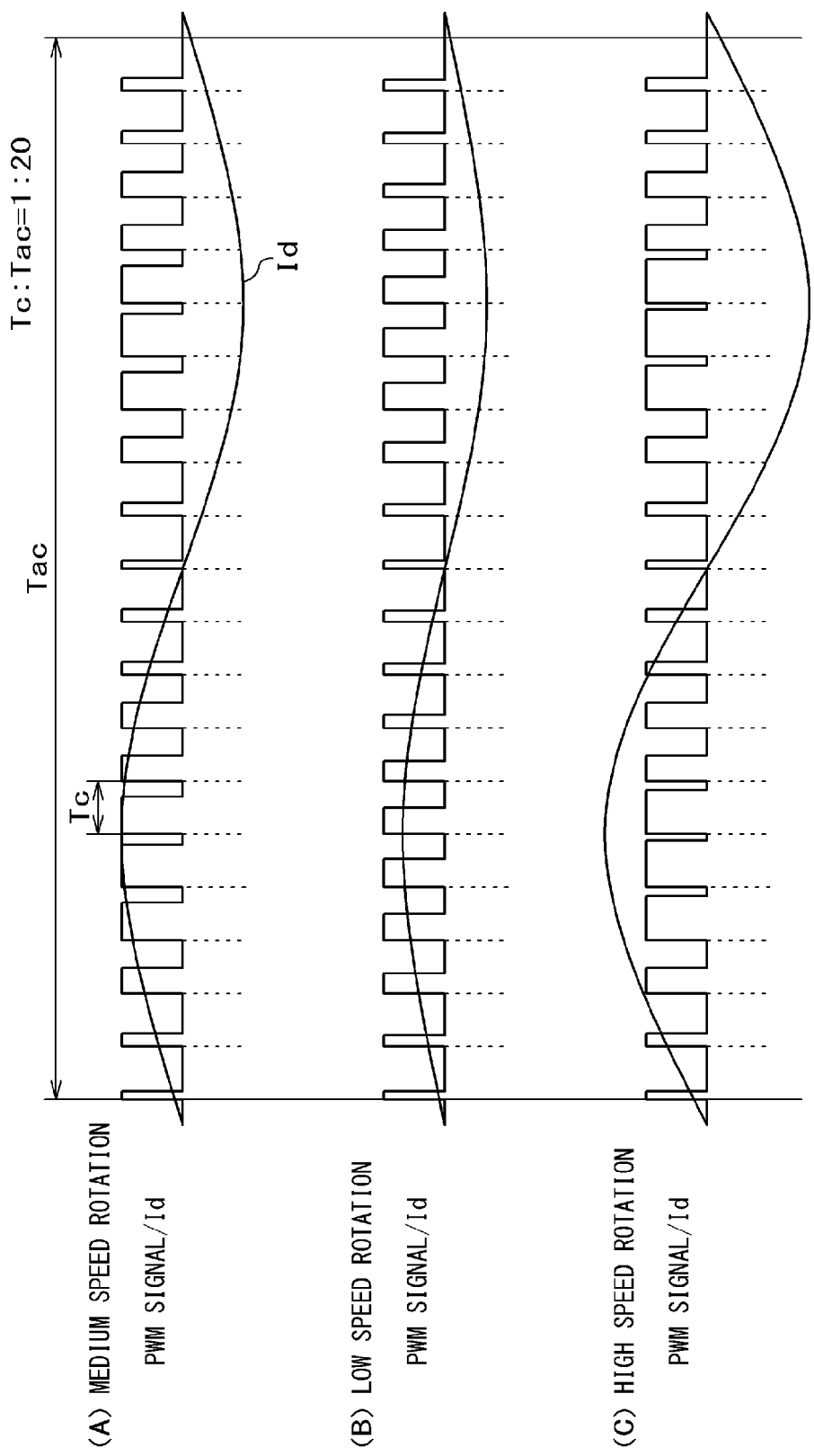
FIG. 11 is a timing chart for explaining the relationship between PWM control and a motor current in one power supply period.

FIG. 11 is a diagram of examples of PWM signal patterns in controlling the three-phase motor. (A) in FIG. 11 is a waveform in medium speed rotation, (B) in FIG. 11 is a waveform in low speed rotation, and (C) in FIG. 11 is a waveform in high speed rotation. In (A) to (C) in FIG. 11, Tc:Tac=1:20, where a carrier period (the inverse of a carrier frequency) is defined as Tc (1/f c) and one power supply period (the inverse of one power supply frequency) is defined as Tac (1/fac). The duration period of the PWM signal is controlled according to the rotation speed and the motor phase. In order to increase the rotation speed, the duration period of the PWM signal is increased, whereas in order to reduce the rotation speed, the duration period of the PWM signal is reduced. According to the rotation speed, the motor control signal (the PWM signal) is sent from the driver IC 30 to the IGBT 22 of the power semiconductor device 21 in such a manner that the waveform of the motor current (the drive current (Id)) is a sine wave for each power supply period (Tac).

Operation Timing of the Temperature Prediction Calculation Circuit

Figure 15:
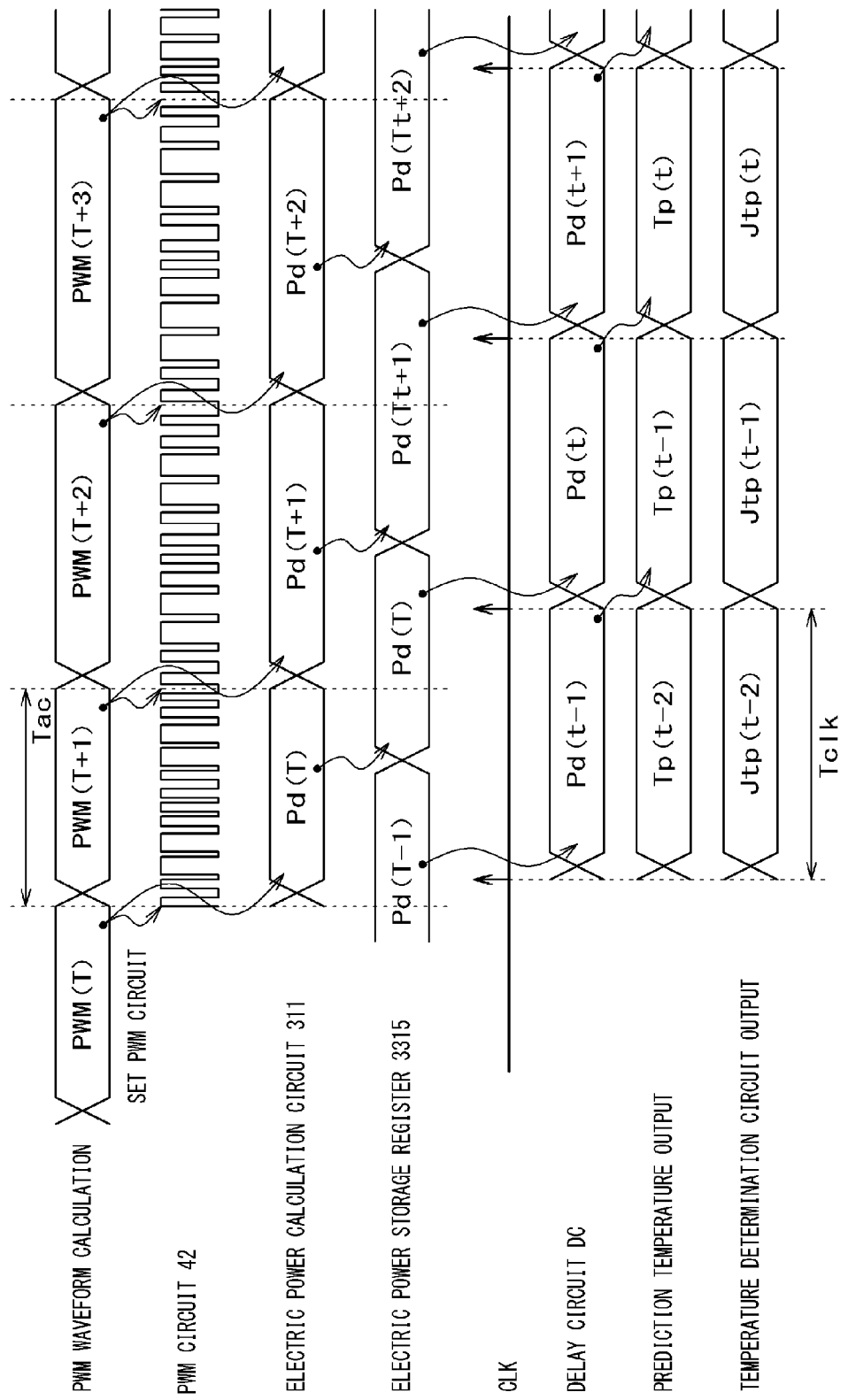
FIG. 15 is a timing chart for explaining the operation of the temperature prediction calculation circuit.

FIG. 15 is a timing chart of the operation of the temperature prediction calculation circuit. The motor control unit 411 sets a result (PWM(T)) of calculating a PWM waveform to the PWM circuit 42. The PWM circuit 42 generates and outputs PWM signals based on the settings. Concurrently, the motor control unit 411 sets electric power parameters determined from PWM(T) to the electric power calculation parameter register 3311. The PWM waveform is calculated, and then the PWM signal is outputted based on the calculation in a delay of one power supply period (Tac). The electric power calculation circuit 331 calculates the generated electric power (Pd(T)) for each power supply period based on the electric power parameters, and stores Pd(T) on the electric power storage register 3315.

The thermal history circuit 332 captures Pd(T) as Pd(t) in the delay circuit DC0 at a thermal history sampling clock (CLK), and then captures Pd(T) as Pd(t) in the delay circuit DC1 at the subsequent CLK. The thermal history circuit 332 reflects Pd(t) in the calculation of the prediction temperature (Tp(t)), and then outputs the prediction temperature (Tp(t)) to the temperature determination circuit 333. The temperature determination circuit 333 outputs the temperature prediction determination (Jtp(t)). The generated electric power value (Pd(t)) is outputted, and then the prediction temperature (Tp(t)) based on the generated electric power value (Pd(t)) and the temperature prediction determination (Jtp(t)) are outputted in a delay of one thermal history calculation sampling clock period (Tclk, which is also referred to as a thermal history calculation fundamental period).

Figure 16:
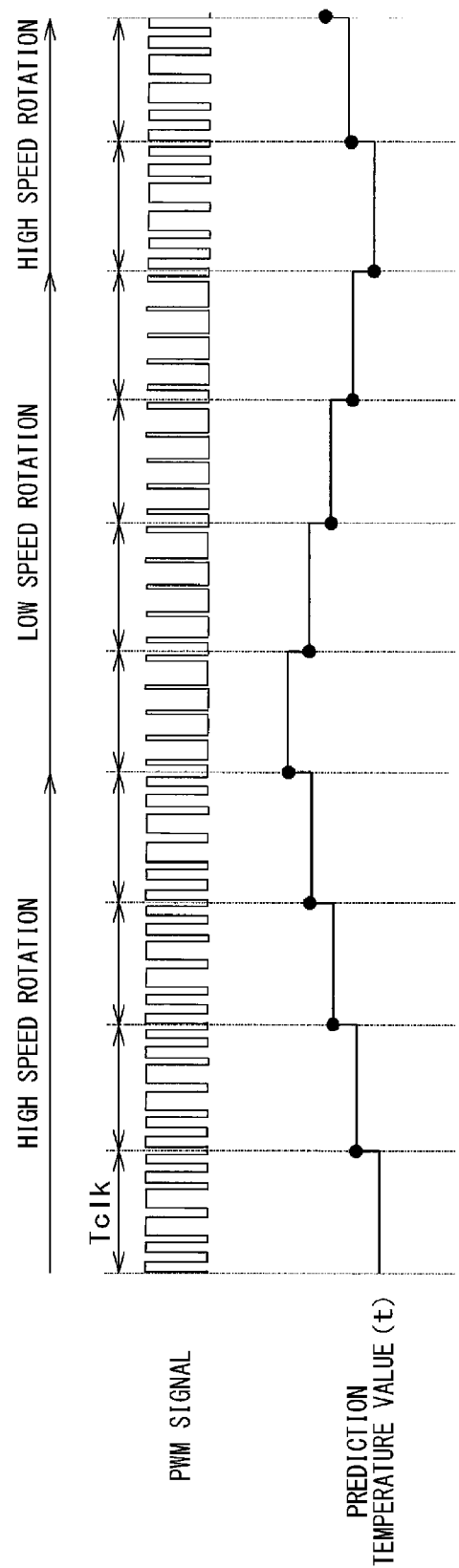
FIG. 16 is a timing chart for explaining the operation of the temperature prediction calculation circuit.

FIG. 16 is a timing chart of the relationship between the drive signal and a value of the prediction temperature. In FIG. 16, one power supply period (a power supply frequency) and one sampling clock period (a sampling clock frequency) are the same. Note that, one power supply period is typically about one millisecond or less. As illustrated in FIG. 16, in high speed rotation, the duty ratio of the PWM signals is increased, and thus the prediction temperature is also increased. On the other hand, in low speed rotation, the duty ratio of the PWM signals is decreased, and the prediction temperature is decreased. From this operation timing, the prediction temperature is calculated for each sampling clock period (Tclk). Thus, the temperature can be predicted at high speed.

Operation Method for the Temperature Prediction Calculation Circuit

Figure 25:
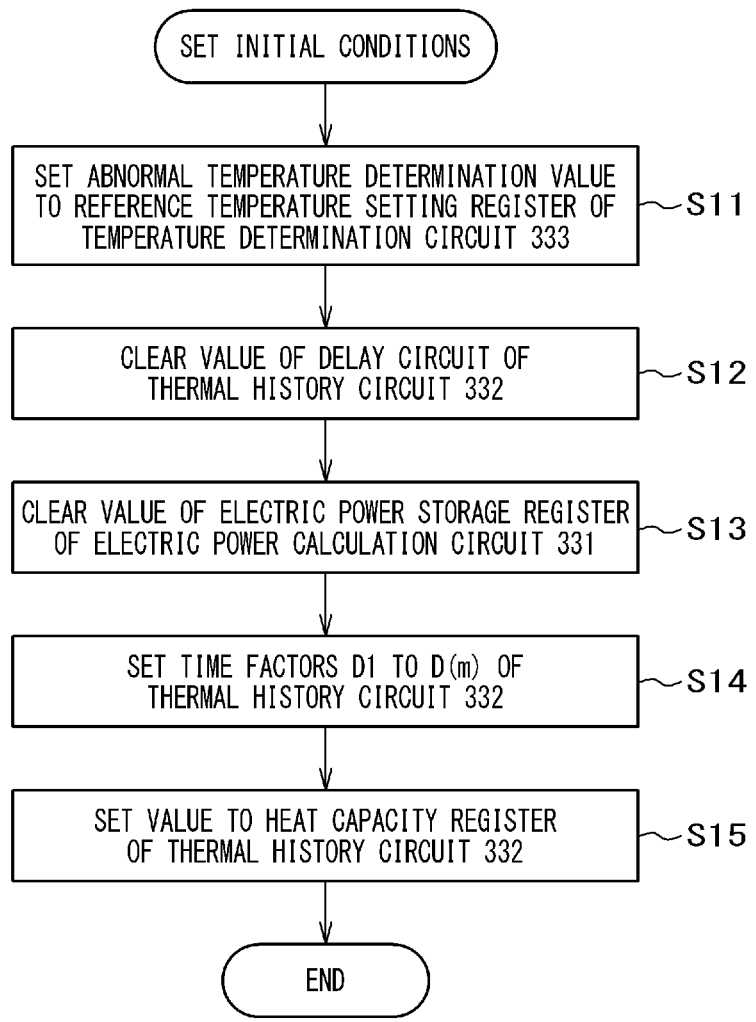
FIG. 25 is a flowchart for explaining an initial setting method for the temperature prediction calculation circuit.

FIG. 25 is a flowchart of an initial setting method for the temperature prediction calculation circuit. The motor control unit 411 of the CPU 41 sets an abnormal temperature determination value (a reference temperature) to the reference temperature setting register 3335 of the temperature determination circuit 333 (Step S11). The motor control unit 411 clears the values of the delay circuits 3321, 3322, 3323, and 3324 of the thermal history circuit 332 (Step S12). The motor control unit 411 clears the value of the electric power storage register 3315 of the electric power calculation circuit 331 (Step S13). The motor control unit 411 sets a value corresponding to the temperature heat dissipation characteristics to the time factor (D(n)) of the thermal history circuit 332 (Step S14). The motor control unit 411 sets a value corresponding to the heat capacity of the power semiconductor device to the heat capacity register 3326 of the thermal history circuit 332 (Step S15).

Figure 26:
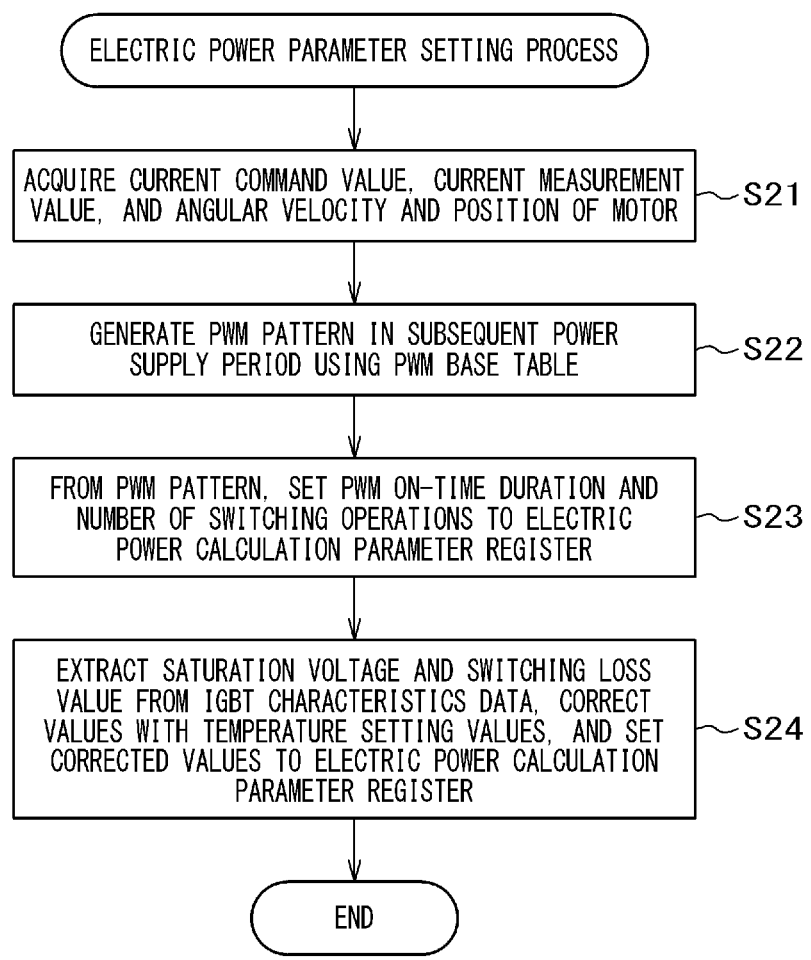
FIG. 26 is a flowchart for explaining a setting method for electric power parameters to the temperature prediction calculation circuit.

FIG. 26 is a flowchart of the setting method for the electric power parameters to the temperature prediction calculation circuit. The motor control unit 411 of the CPU 41 performs an electric power setting process for each power supply period. The motor control unit 411 acquires the current command value (the torque command), the present current measurement value, and the angular velocity and position of the motor (Step S21). The motor control unit 411 generates a PWM pattern for the subsequent power supply period based on the values acquired in Step S21 using the PWM base table 451 (Step S22). From the PWM pattern generated in Step S22, the motor control unit 411 sets the PWM ON duration period and the number of switching operations to the electric power calculation parameter register 3311 (Step S23). The motor control unit 411 acquires the saturation voltage, the turn-on loss value, and the turn-off loss value from the IGBT characteristics data 452, corrects the values with the present temperature measurement value, and sets the corrected values to the electric power calculation parameter register 3311 (Step S24).

Derivation Method for the Electric Power Parameters of the Electric Power Calculation Circuit For motor control signals, the motor control unit 411 of the CPU 41 generates the PWM signal pattern in advance. Thus, in the electric power parameters necessary to calculate electric power, the PWM ON duration period (t) and the number of switching operations (Non, Noff) are known. In the electric power parameters, derivation methods for the saturation voltage (Vce(sat)), the drive current (Id), and the switching losses (Eon and Eoff)) will be described.

Figure 12:
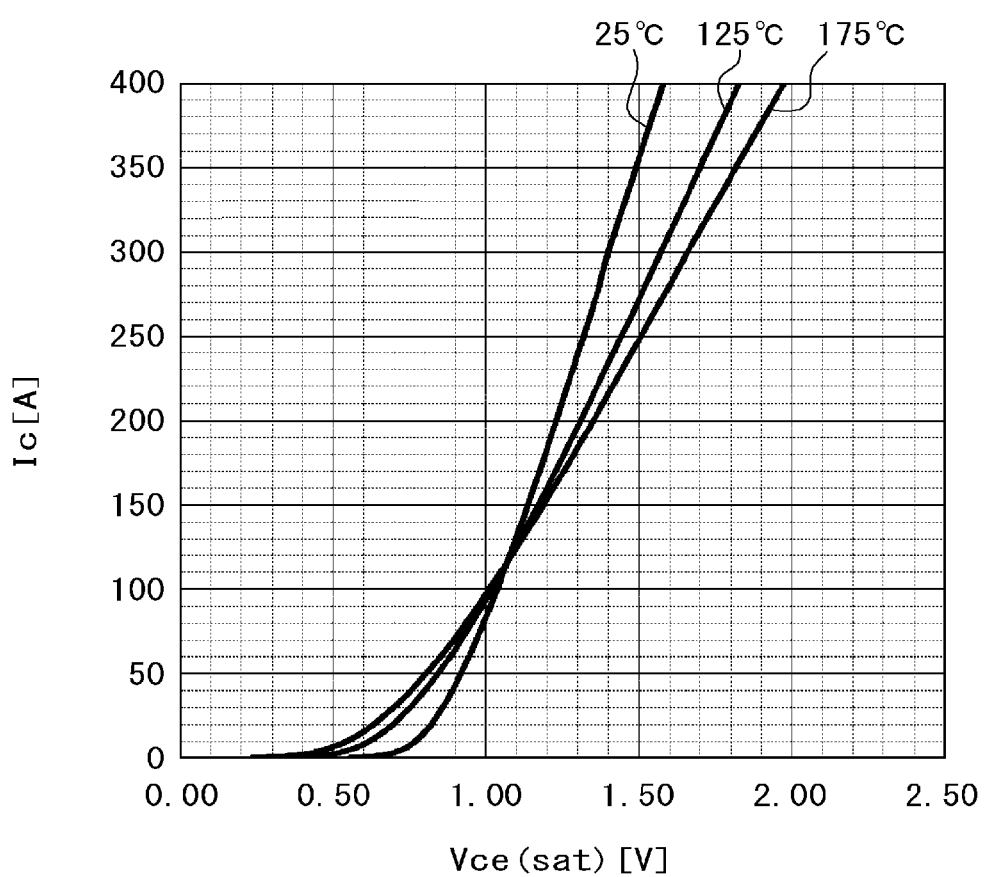
FIG. 12 is a diagram for explaining the characteristics of the saturation voltage to the drive current in the IGBT.

FIG. 12 is a diagram of the characteristics of the saturation voltage to the drive current in the IGBT. FIG. 12 illustrates the characteristics at a gate-to-emitter voltage (Vge) of 15 V. The saturation voltage (Vce(sat)) has dependence on the collector current (Ic), i.e. the drive current (Id). Thus, the characteristics as illustrated in FIG. 12 are stored as the IGBT characteristics data 452 on the storage device 45. The motor control unit 411 finds Vce(sat) from the IGBT characteristics data 452 based on the Id measurement value.

Figure 13:
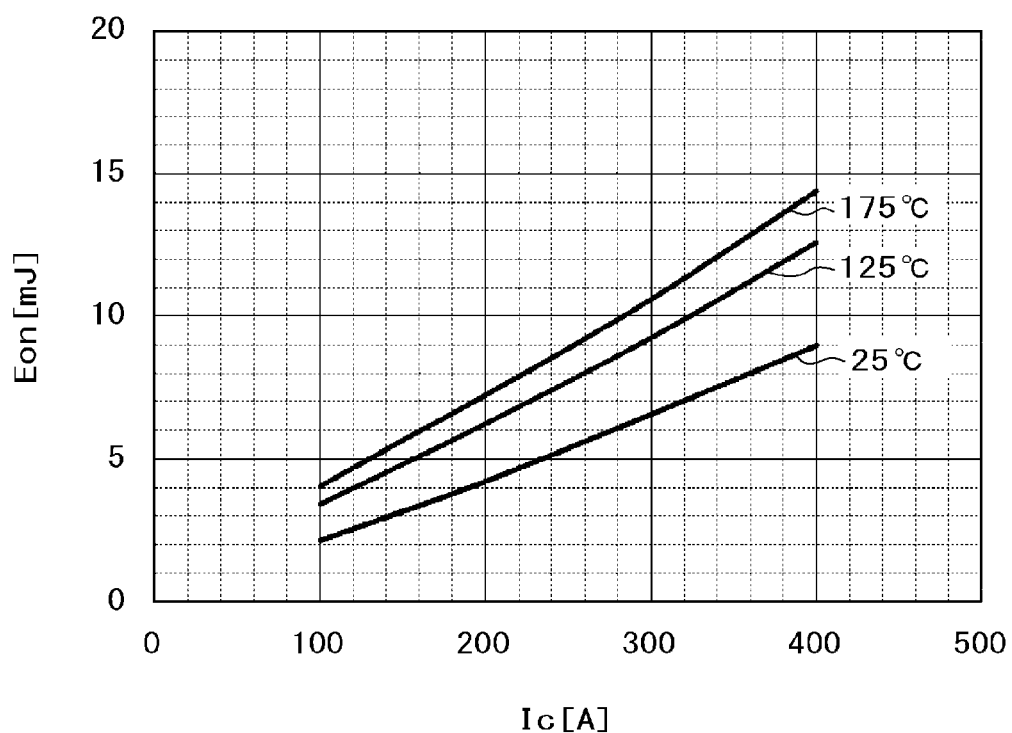
FIG. 13 is a diagram for explaining the characteristics of the drive current to the turn-on loss in the IGBT.
Figure 14:
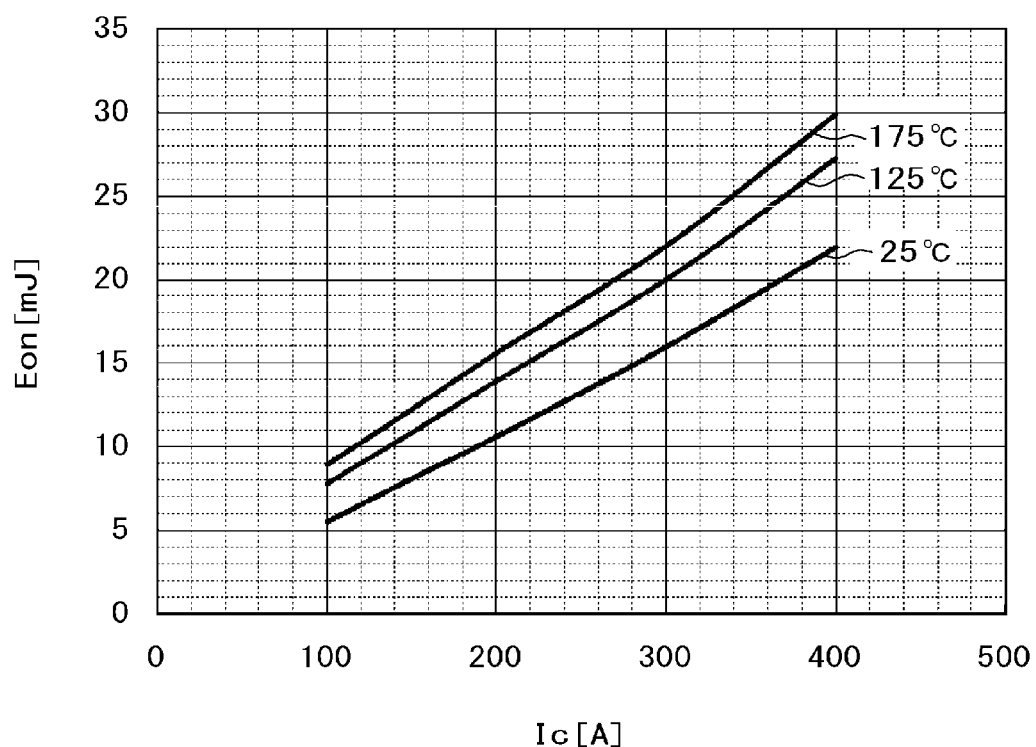
FIG. 14 is a diagram for explaining the characteristics of the drive current to the turn-off loss in the IGBT.

FIG. 13 is a diagram of the characteristics of the drive current to the turn-on loss in the IGBT. FIG. 13 illustrates the characteristics at the collector-to-emitter voltage (Vice)= 400 V and Vge=15 V. FIG. 14 is a diagram of the characteristics of the drive current to the turn-off loss in the IGBT. The turn-on loss value (Eon) and the turn-off loss (Eoff) have dependence on temperatures. Thus, the characteristics as illustrated in FIGS. 13 and 14 are stored as the IGBT characteristics data 452 on the storage device 45. The motor control unit 411 finds Eon and Eoff from the IGBT characteristics data 452 based on the temperature measurement value sent from the temperature detection circuit 32 using the temperature detection diode D1 of the power semiconductor device 21.

In this manner, the motor control unit 411 derives Vce (sat), Id, Eon, and Eoff in the electric power parameters.

Thus, the saturation voltage (Vce(sat)) and the switching losses (Eon and Eoff)) can be found in the electric power parameters with no delay. As described above, the motor control unit 411 of the CPU 41 generates the PWM signal pattern for the motor control signal in advance. Thus, in the electric power parameters necessary to calculate electric power, the PWM ON duration period (t) and the number of switching operations (Non, Noff) are known. Accordingly, the electric power parameters necessary to calculate the generated electric power can be prepared with no delay.

Derivation Method for Coefficients of the Thermal History Circuit

Figure 17:
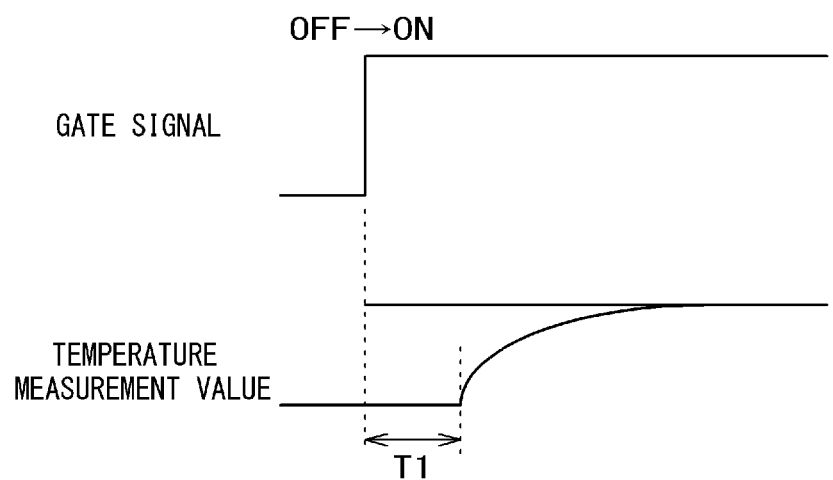
FIG. 17 is a diagram for explaining the temperature rise characteristics of the IGBT.
Figure 18:
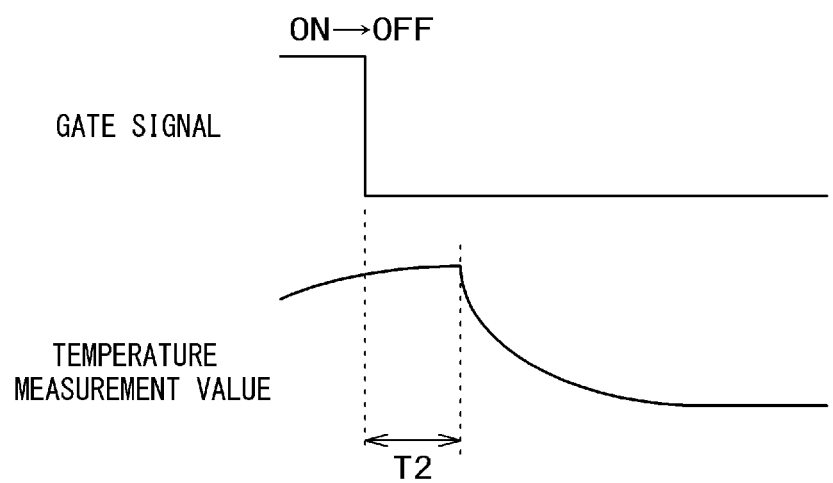
FIG. 18 is a diagram for explaining the temperature drop characteristics of the IGBT.

FIG. 17 is a diagram of the temperature rise characteristics of the IGBT. FIG. 18 is a diagram of the temperature drop characteristics of the IGBT. From the heat capacity (the heat-sink heat capacity 55, the interconnect heat capacity 54, and the junction heat capacity 53) of the equivalent circuit in FIG. 8, the temperature rise in FIG. 17 has a delay of time T1 (response time). The temperature drop in FIG. 18 has a delay of time T2 (response time). The motor control unit 411 calculates the heat capacity from the relationship between these delays (T1 and T2), and sets the heat capacity to the heat capacity register 3326 of the thermal history circuit 332. The delays (T1 and T2) include propagation time from the heat generation source in the power semiconductor device 21 to the temperature detection diode D1. Thus, time for the propagation time is excluded. The motor control unit 411 calculates a heat dissipation factor (a time factor (D(n)) suitable for heat dissipation characteristics) from a slope after starting the temperature rise in FIG. 17 and a slope after starting the temperature drop in FIG. 18.

Figure 19:
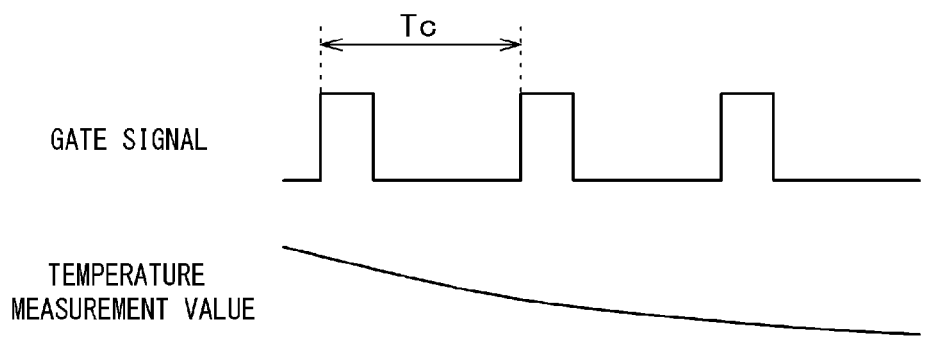
FIG. 19 is a diagram for explaining the duty of the gate signal and the temperature characteristics of the IGBT.
Figure 20:
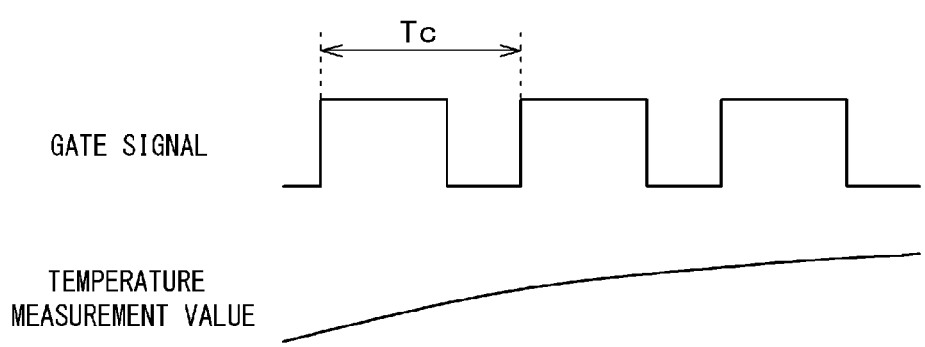
FIG. 20 is a diagram for explaining the duty of the gate signal and the temperature characteristics of the IGBT.
Figure 21:
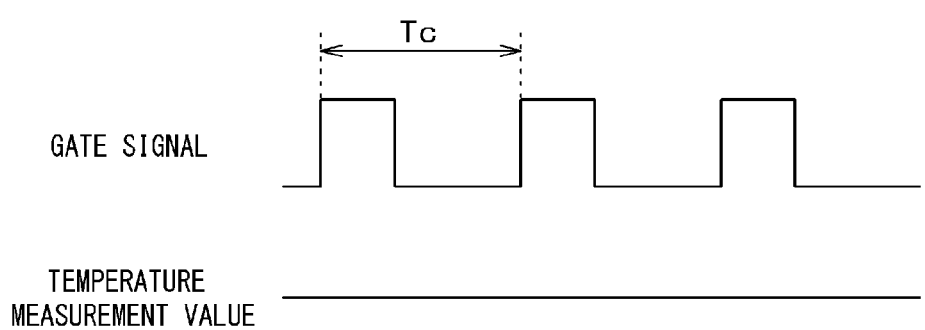
FIG. 21 is a diagram for explaining the duty of the gate signal and the temperature characteristics of the IGBT.

FIGS. 19, 20, and 21 are diagrams of the temperature characteristics when the duty ratio of the gate signals of the IGBT is changed. The carrier period (Tc) is set to a vale the same as the value of the sampling period (Tclk) of the thermal history circuit 332. The temperature characteristics when the duty ratio of the gate signals is changed are monitored using the temperature detection diode D1 of the power semiconductor device 21, for example. As illustrated in FIG. 19, commonly, in the case in which the duty ratio is low, a decrease in the ON duration period drops the temperature. As illustrated in FIG. 20, on the contrary, in the case in which the duty ratio is increased, the temperature usually rises. As illustrated in FIG. 21, in the case of a specific duty ratio, heat dissipation becomes the same as heat generation, causing no change in the temperature.

Figure 22:
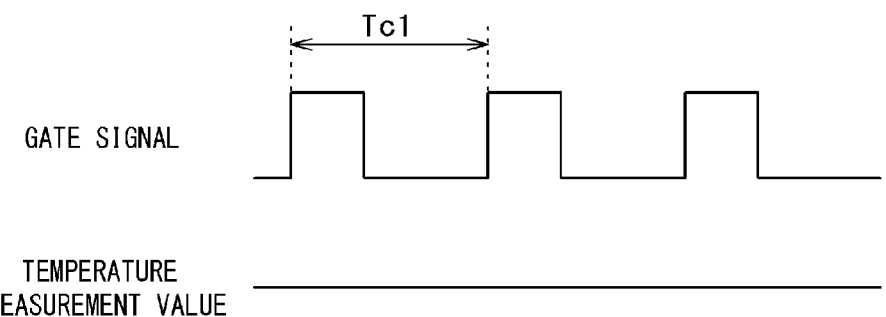
FIG. 22 is a diagram for explaining the carrier period of the gate signal and the temperature characteristics of the IGBT.
Figure 23:
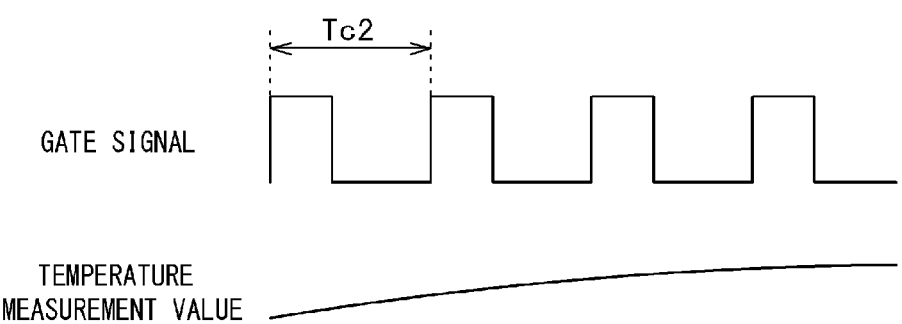
FIG. 23 is a diagram for explaining the carrier period of the gate signal and the temperature characteristics of the IGBT.
Figure 24:
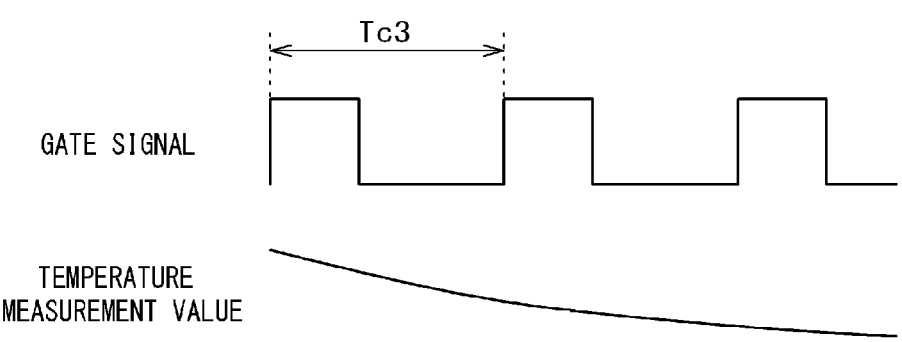
FIG. 24 is a diagram for explaining the carrier period of the gate signal and the temperature characteristics of the IGBT.

FIG. 22 is a diagram of a carrier period in the case in which the temperature becomes constant in FIG. 21. FIG. 23 is a diagram of the temperature characteristics in the case in which the carrier period is shorter than that in FIG. 22. FIG. 24 is a diagram of the temperature characteristics in the case in which the carrier period is longer than that in FIG. 22. In order to measure carrier frequency dependence, the temperature characteristics caused by a change in the carrier period are measured as the duty ratio of the carrier period in FIG. 21, in which the temperature is constant, is maintained. As illustrated in FIG. 23, in the case in which the carrier period (Tc2) is shorter than Tc1, the number of switching operations per predetermined time period is increased. Thus, the temperature tends to rise. On the contrary, as illustrated in FIG. 24, in the case in which the carrier period (Tc3) is longer than Tc1, the number of switching operations is decreased, and the temperature tends to drop. From the relationship between the carrier period and the temperature, also in the case in which the carrier period is greatly changed, the heat dissipation factor (the time factor (D(n)) suitable for the heat dissipation characteristics) is corrected. Thus, the accuracy of the temperature prediction value can be improved.

Figure 27:
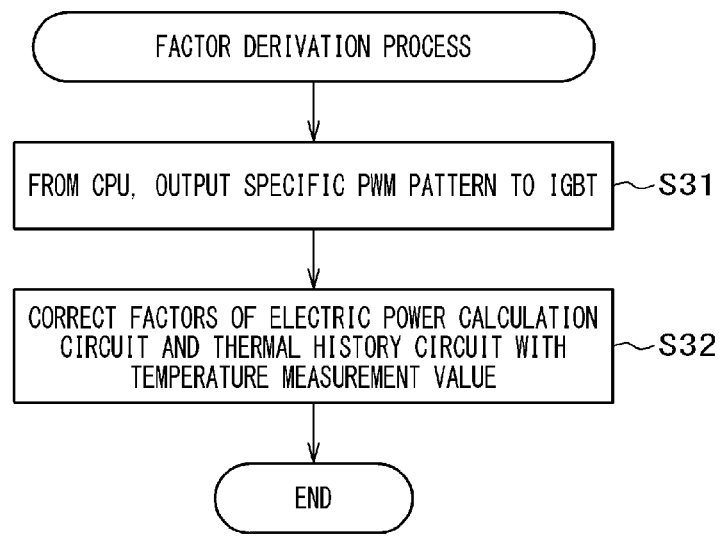
FIG. 27 is a flowchart for explaining a factor derivation process for the temperature prediction calculation circuit.

FIG. 27 is a flowchart of the factor derivation process for the temperature prediction calculation circuit. The motor control unit 411 generates PWM signals at the PWM circuit 42 based on a specific PWM pattern, and outputs the generated PWM signals to the IGBT 22 through the gate circuit 31 (Step S31). The motor control unit 411 corrects the electric power parameters of the electric power calculation circuit 331 and the coefficients of the thermal history circuit 332 from the temperature measurement value (Step S32). In order to correct the coefficient values for calculating temperatures, the temperature characteristics when the PWM drive pattern is changed variously are checked. Thus, the characteristics of the individual IGBTs and the relative variations can be calculated. It is necessary to adjust the parameters and the coefficients by correcting them, because the device characteristics are varied. For example, the heat sinks receive different air or water circulation depending on the installed locations, resulting in different coefficients, or the devices differently have Vce(sat), resulting in variations in the amount of power consumption. Thus, the accuracy of the temperature prediction value can be improved.

Motor Control Abnormality Monitoring Process

Figure 28:
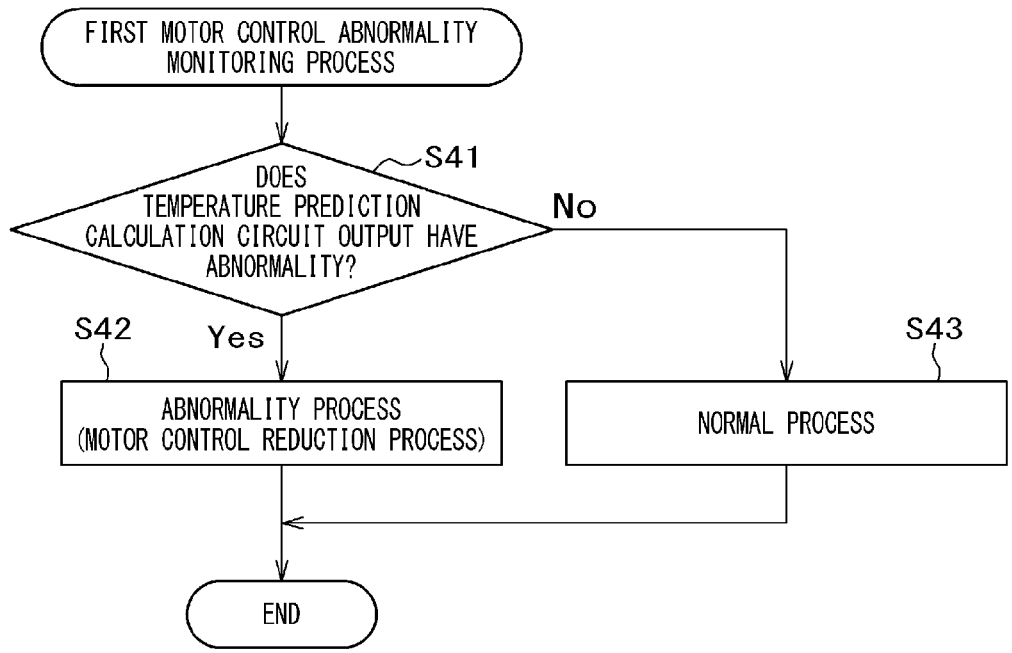
FIG. 28 is a flowchart for explaining a motor control abnormality monitoring process.

FIG. 28 is a flowchart of a first abnormality monitoring process for controlling the motor. The motor control unit 411 determines whether the determined result at the temperature prediction calculation circuit 33 shows an abnormality (Step S41). In the case in which the determined result at the temperature prediction calculation circuit 33 shows an abnormality (Yes in Step S41), the motor control unit 411 performs an abnormality process (a motor control reduction process) (Step S42). In the case in which the determined result at the temperature prediction calculation circuit 33 shows normality (No in Step S41), the motor control unit 411 performs a normal process.

Thus, the temperature of the switching transistor can be predicted. Therefore, even in the case in which the thermal conduction time between the heat generating unit of the switching transistor and the temperature detector is long and this causes a delay in the detection of a temperature, interrupt control is performed based on the prediction temperature. Thus, the possibility of exceeding the allowable operating temperature of the switching device caused by a delay in the response time is reduced. It is unnecessary to provide an interrupt set value with a margin, taking into account of a slow response time. Therefore, the allowable operating temperature of the switching device is not narrowed.

Figure 29:
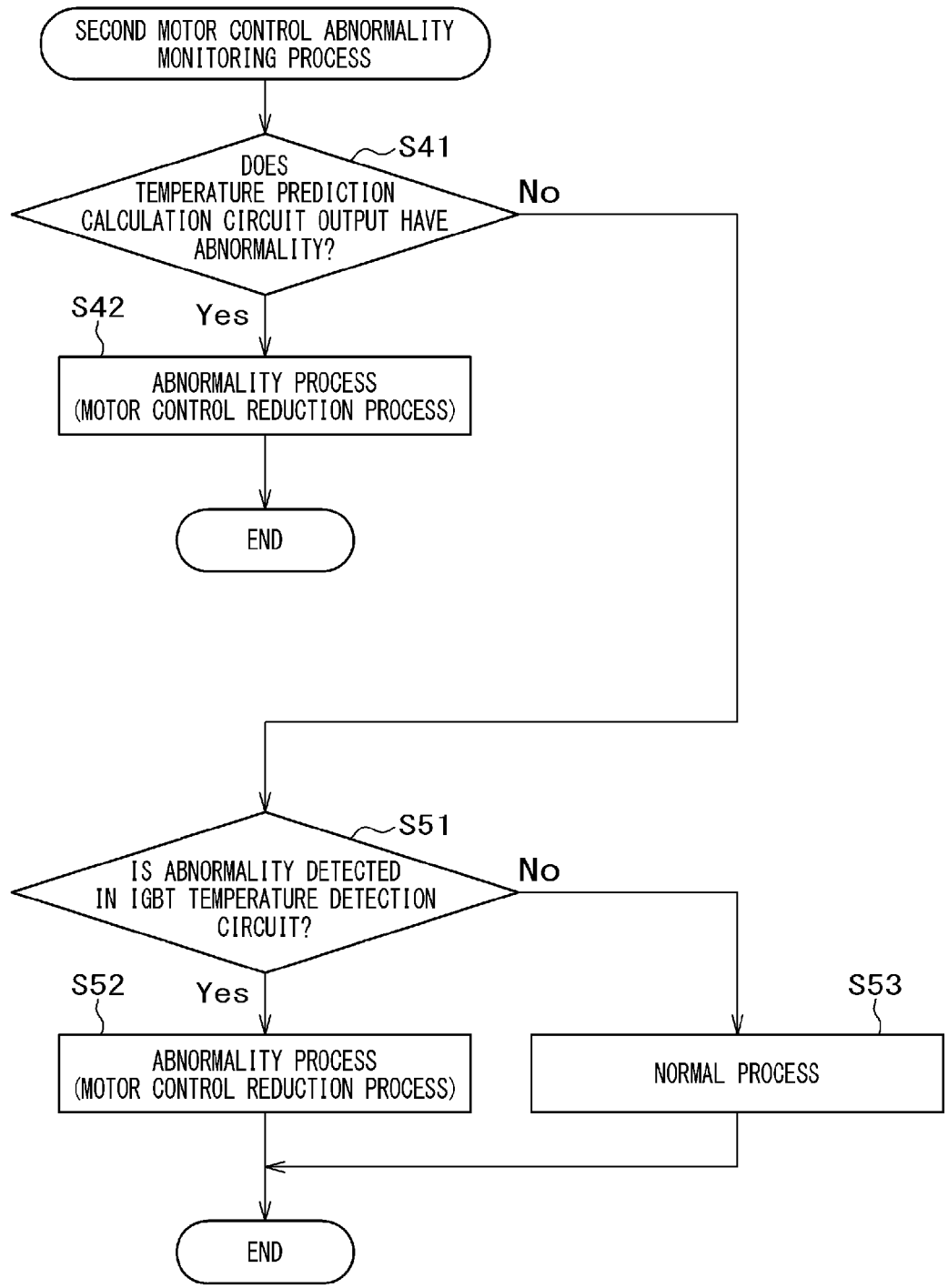
FIG. 29 is a flowchart for explaining a motor control abnormality monitoring process.

FIG. 29 is a flowchart of a second abnormality monitoring process for controlling the motor. The motor control unit 411 performs the first abnormality monitoring process for controlling the motor described above. After that, in the case in which the temperature prediction value shows no abnormal temperature, the motor control unit 411 determines whether the temperature detection circuit 32 shows an abnormality (Step S51). In the case in which the temperature measurement value of the temperature detection circuit 32 shows an abnormality (Yes in Step S51), the motor control unit 411 performs an abnormality process (a motor control reduction process) (Step S52). In the case in which the temperature measurement value of the temperature detection circuit 32 shows normality (No in Step S51), the motor control unit 411 performs a normal process.

Thus, through two systems, i.e. the temperature prediction value and the temperature measurement value, an abnormal temperature can be detected for interrupt control. Accordingly, even though the detection of abnormal temperatures based on the temperature prediction value fails because of some reason, an abnormal temperature can be detected based on the temperature measurement value.

Second Embodiment

Figure 30:
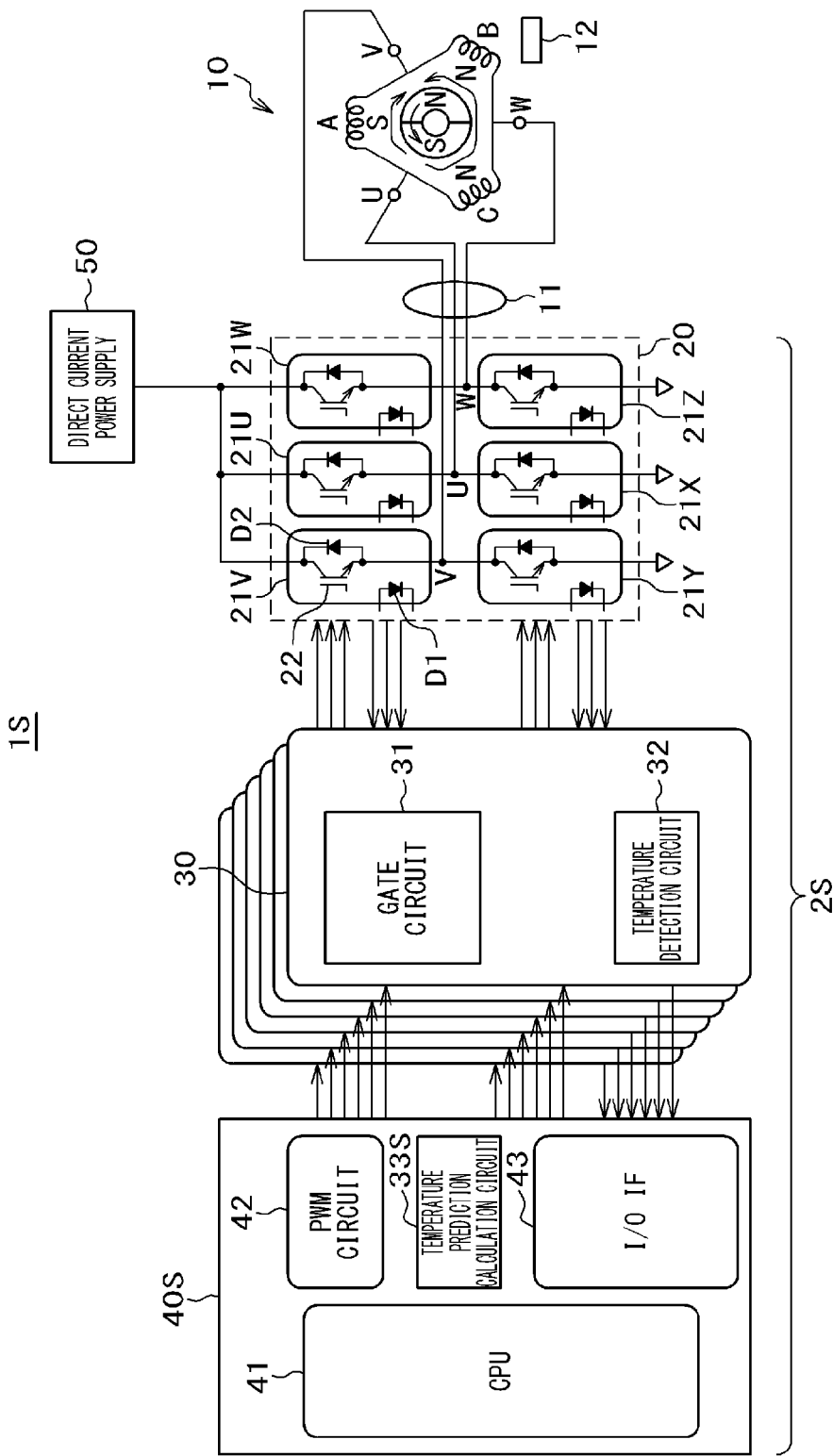
FIG. 30 is a block diagram for explaining an electric motor system according to a second embodiment.
Figure 31:
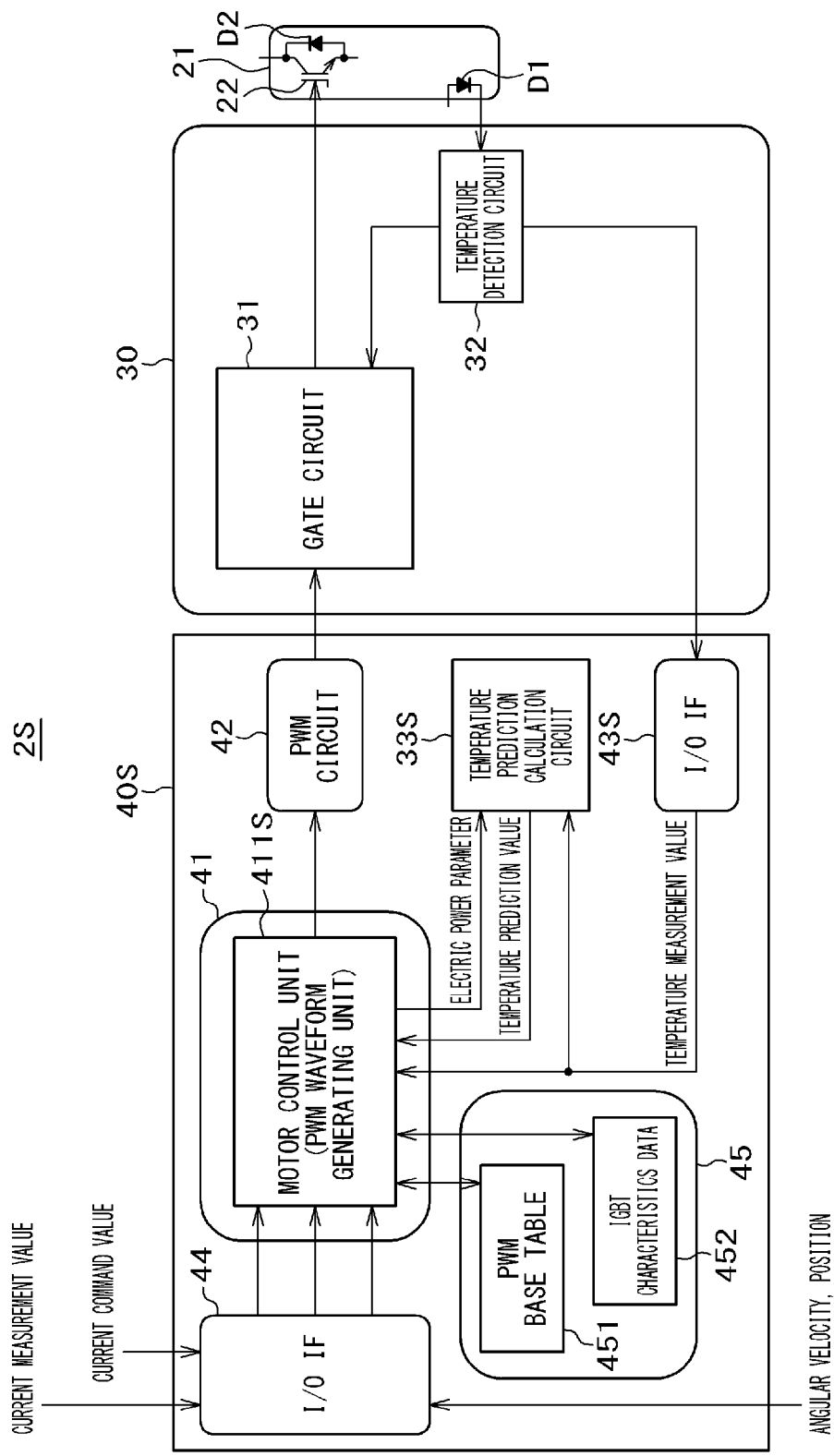
FIG. 31 is a block diagram for explaining an electronics device according to the second embodiment.

FIG. 30 is a block diagram of the configuration of an electric motor system according to a second embodiment. FIG. 31 is a block diagram of an electronics device, which is a part of the electric motor system according to the second embodiment. In the electric motor system 1 according to the first embodiment, the temperature prediction calculation circuit 33 is built-in in each of the driver ICs 30. However, in an electric motor system 1S according to the second embodiment, no temperature prediction calculation circuit is built-in in the driver IC 30. In a control circuit 40S, six temperature prediction calculation circuits 33S are built-in. Except these configurations, the electric motor system 1S has a configuration similar to the configuration of the electric motor system 1. An electronics device 2S is configured of a power module 20, six driver ICs 30S, and a control circuit 40S.

Figure 32:
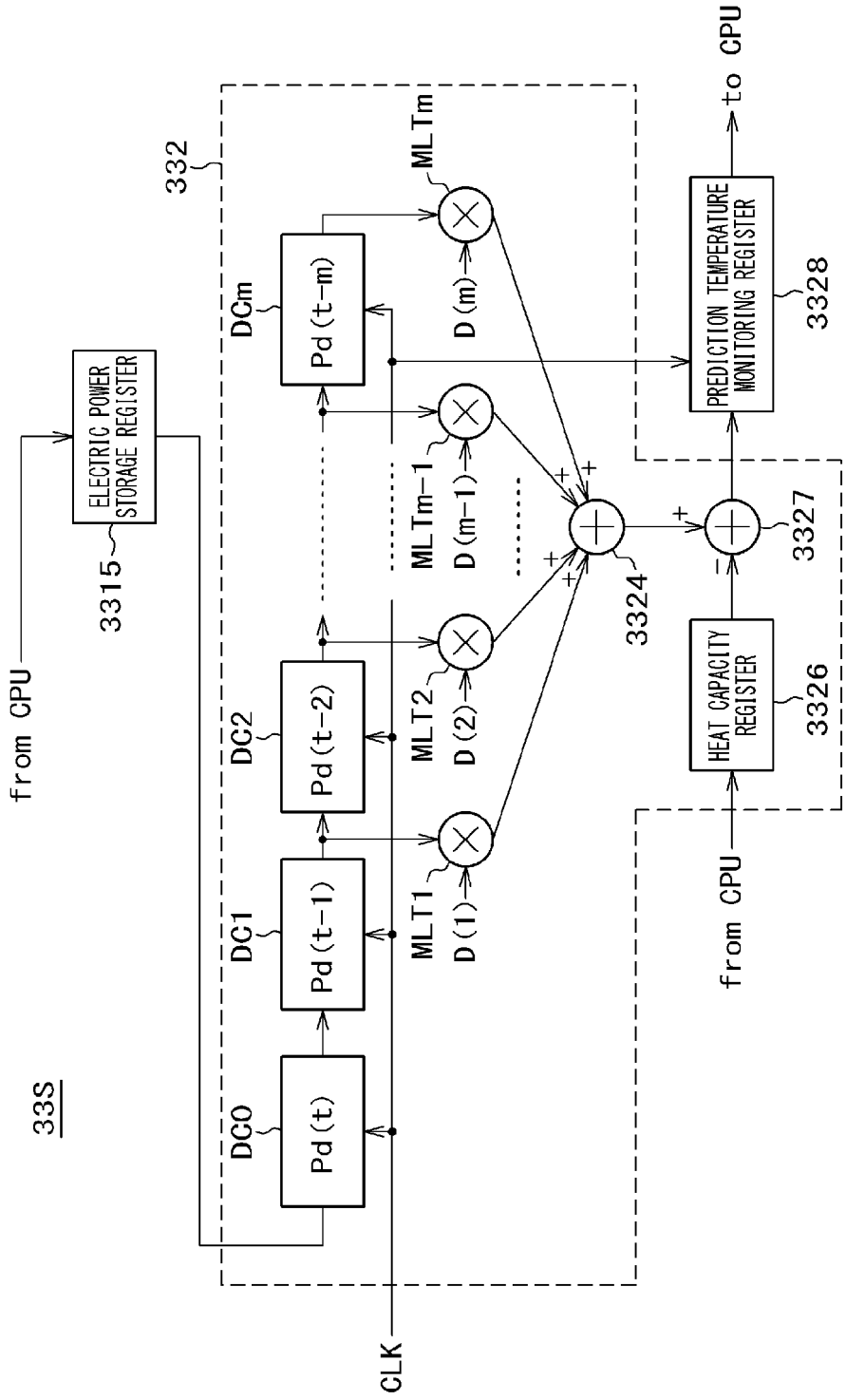
FIG. 32 is a block diagram for explaining a temperature prediction calculation circuit according to the second embodiment.

FIG. 32 is a block diagram of a temperature prediction calculation circuit according to the second embodiment. A temperature prediction calculation circuit 33S includes components similar to ones of the thermal history circuit 332 of the temperature prediction calculation circuit 33 according to the first embodiment. However, the temperature prediction calculation circuit 33S includes no components corresponding to the electric power calculation circuit 331 and the temperature determination circuit 333 of the temperature prediction calculation circuit 33 according to the first embodiment. In the embodiment, a motor control unit 411S of a CPU 41 executes calculations by software, which are performed by hardware at the electric power calculation circuit 331. The motor control unit 411S of the CPU 41 performs determinations by software, which are performed by hardware at the temperature determination circuit 333. However, the temperature prediction calculation circuit 33S includes an electric power storage register 3315 that stores generated electric power calculated at the motor control unit 411S and a prediction temperature monitoring register 3328 that stores prediction temperatures calculated at a thermal history circuit 332. Thus, the arithmetic circuits for the electric power calculation circuit and the temperature determination circuit can be eliminated. The transmission of signals between the driver IC 30S and the control circuit 40S is reduced. Therefore, the number of isolators can be reduced. Note that, a configuration may be possible in which the CPU 41 performs calculations at the temperature prediction calculation circuit 33S by software and the temperature prediction calculation circuit 33S is eliminated.

The derivation method for the electric power parameters of the electric power calculation circuit according to the first embodiment is similarly performed in the case in which the motor control unit 411S of the CPU 41 calculates electric power. The derivation method for various coefficients of the temperature prediction calculation circuit according to the first embodiment is similarly performed also in the second embodiment. The motor control abnormality monitoring process according to the first embodiment is similarly performed also in the second embodiment.

As described above, the invention made by the present inventor is described specifically based on the embodiments. However, the present invention is not limited to the embodiments. It is without saying that the present invention can be variously modified and altered.

What is claimed is:

1. A semiconductor integrated circuit device comprising:
   a temperature prediction calculation circuit that predicts a temperature of a power semiconductor device including a built-in switching transistor and a built-in temperature detection diode,
   wherein the temperature prediction calculation circuit includes
   a delay circuit that stores a history of electric power values for a specific number of times, the electric power values being calculated based on a steady loss and a switching loss of the switching transistor, and
   a calculation circuit that calculates a prediction temperature of the power semiconductor device based on a value of the delay circuit and a time factor corresponding to a temperature heat dissipation characteristic.

2. The semiconductor integrated circuit device according to claim 1,
   wherein: the steady loss is calculated based on a PWM signal duration period for a fundamental control period and a saturation voltage and a drive current of the switching transistor; and
   the switching loss is calculated based on a number of switching operations, a turn-on loss, and a turn-off loss.

3. The semiconductor integrated circuit device according to claim 1,
   wherein the time factor is decreased with a lapse of time.

4. The semiconductor integrated circuit device according to claim 1,
   wherein the calculation circuit includes
   a multiplier that multiplies a value of the delay circuit by a time factor corresponding to a temperature heat dissipation characteristic, and
   a first adder that adds a value of the multiplier.

5. The semiconductor integrated circuit device according to claim 1,
   wherein the temperature prediction calculation circuit corrects an output of the calculation circuit with a heat capacity to find the prediction temperature.

6. The semiconductor integrated circuit device according to claim 5,
   wherein: the temperature prediction calculation circuit includes a heat capacity register and a second adder; and
   the second adder subtracts a value of the heat capacity register from the output of the calculation circuit.

7. The semiconductor integrated circuit device according to claim 2,
   wherein the temperature prediction calculation circuit includes
   an electric power value calculation circuit that calculates the electric power value, and
   a temperature determination circuit that detects an abnormal temperature of the power semiconductor device based on the prediction temperature.

8. The semiconductor integrated circuit device according to claim 7,
   wherein the electric power value calculation circuit includes
   an electric power calculation parameter register that stores a PWM signal duration period for the fundamental control period, the saturation voltage, the drive current, the number of switching operation, the turn-on loss, and the turn-off loss,
   a first circuit that calculates the steady loss for one power supply period based on the PWM signal duration period for the fundamental control period, the saturation voltage, and the drive current,
   a second circuit that calculates the switching loss for one power supply period based on the number of switching operations, the turn-on loss, and the turn-off loss,
   an adder that adds an output of the first circuit to an output of the second circuit, and
   an electric power storage register that stores an output of the adder.

9. The semiconductor integrated circuit device according to claim 5,
   wherein: the temperature prediction calculation circuit includes a temperature determination circuit that detects an abnormal temperature of the power semiconductor device based on a value of the prediction temperature; and
   the temperature determination circuit includes
   a determination circuit that determines a sign of the prediction temperature,
   an adder that adds the prediction temperature to a temperature measurement value,
   a selector that selects the temperature measurement value or an output of the adder based on an output of the determination circuit,
   a reference temperature setting register that stores a reference temperature, and
   a comparator that compares an output of the selector with an output of the reference temperature setting register.

10. The semiconductor integrated circuit device according to claim 7, further comprising:
    a gate circuit that drives the switching transistor; and
    a temperature detection circuit that detects a temperature based on the temperature detection diode.

11. The semiconductor integrated circuit device according to claim 10,
    wherein when the temperature detection circuit detects an abnormal temperature, the temperature detection circuit reduces or stops an output of the gate circuit.

12. The semiconductor integrated circuit device according to claim 2, further comprising:

a CPU; and a PWM circuit that generates a PWM signal for driving the switching transistor.

13. The semiconductor integrated circuit device according to claim 12, wherein the CPU calculates the electric power value, and detects an abnormal temperature of the power semiconductor device based on the prediction temperature.

14. The semiconductor integrated circuit device according to claim 13, further comprising a storage device that stores a PWM base table and switching transistor characteristics data, wherein the CPU generates a PWM pattern from the PWM base table based on a current command value, a drive current measurement value, and an angular velocity and a position of a motor, acquires the PWM signal duration period and the number of switching operations from the PWM pattern, acquires the saturation voltage, the turn-on loss, and the turn-off loss from the characteristics data, and calculates the electric power value.

15. The semiconductor integrated circuit device according to claim 14, wherein the CPU acquires a temperature measurement value, and corrects the saturation voltage, the turn-on loss, and the turn-off loss based on the temperature measurement value and the characteristics data.

16. An electronics device comprising:

a power semiconductor device;

a first semiconductor integrated circuit device that drives the power semiconductor device; and a second semiconductor integrated circuit device that controls the first semiconductor integrated circuit device, wherein: the power semiconductor device includes
a switching transistor, and
a temperature detection diode;

the first semiconductor integrated circuit device includes
a gate circuit that drives the switching transistor,
a temperature detection circuit that detects a temperature based on the temperature detection diode, and
a temperature prediction calculation circuit that predicts a temperature of the power semiconductor device;

the second semiconductor integrated circuit device includes
a control unit that outputs parameters including a PWM signal duration period for a fundamental control period, a number of switching operations, and a saturation voltage, a turn-on loss, a turn-off loss and a drive current of the switching transistor to the temperature prediction calculation circuit, and
a storage unit that stores characteristics data for the saturation voltage, the turn-on loss, the turn-off loss and the drive current of the switching transistor; and the temperature prediction circuit includes
an electric power calculation circuit that calculates an electric power value based on the parameters,
a heat delay circuit that stores a history of the electric power values for a specific number of times,
a calculation circuit that calculates a prediction temperature of the power semiconductor device based on a value of the delay circuit and a time factor corresponding to a temperature heat dissipation characteristic, and
a temperature determination circuit that determines an abnormal temperature based on the prediction temperature.

17. The electronics device according to claim 16, wherein when the temperature determination circuit determines an abnormal temperature, the control unit reduces or stops the gate circuit.

18. The electronics device according to claim 16, wherein the control unit acquires a temperature measurement value from the temperature detection circuit, and corrects the saturation voltage, the turn-on loss, and the turn-off loss based on the temperature measurement value and the characteristics data.

19. An electronic device comprising:

a power semiconductor device;

a first semiconductor integrated circuit device that drives the power semiconductor device; and a second semiconductor integrated circuit device that controls the first semiconductor integrated circuit device, wherein: the power semiconductor device includes
a switching transistor, and
a temperature detection diode;

the first semiconductor integrated circuit device includes
a gate circuit that drives the switching transistor, and
a temperature detection circuit that detects a temperature based on the temperature detection diode;

the second semiconductor integrated circuit device includes
a control unit that calculates an electric power value based on parameters including a PWM signal duration period for a fundamental control period, a number of switching operations, and a saturation voltage, a turn-on loss, a turn-off loss and a drive current of the switching transistor,
a storage unit that stores characteristics data for the saturation voltage, the turn-on loss, the turn-off loss and the drive current of the switching transistor, and
a temperature prediction calculation circuit that predicts a temperature of the power semiconductor device;

the temperature prediction circuit includes
a heat delay circuit that stores a history of the electric power values for a specific number of times, and
a calculation circuit that calculates a prediction temperature of the power semiconductor device based on a value of the delay circuit and a time factor corresponding to a temperature heat dissipation characteristic; and the control unit determines an abnormal temperature based on the prediction temperature.

20. The electronics device according to claim 19, wherein the control unit acquires a temperature measurement value from the temperature detection circuit, and corrects the saturation voltage, the turn-on loss, and the turn-off loss based on the temperature measurement value and the characteristics data.

* * * * *